(12) United States Patent
Gojenola et al.

(10) Patent No.: US 9,450,431 B2
(45) Date of Patent: Sep. 20, 2016

(54) RECHARGEABLE BATTERY

(71) Applicant: LeapFrog Enterprises, Inc., Emeryville, CA (US)

(72) Inventors: Paul Andrew Gojenola, San Jose, CA (US); Paul Rymarz, Alameda, CA (US); Lawrence Carlson Tan, Mountain View, CA (US); McKenzie Robert Keith, Corralitos, CA (US); William Brian Greger, San Francisco, CA (US); Alean Daniel, Albany, CA (US)

(73) Assignee: LeapFrog Enterprises, Inc., Emeryville, CA (US)

( * ) Notice: Subject to any disclaimer, the term of this patent is extended or adjusted under 35 U.S.C. 154(b) by 849 days.

(21) Appl. No.: 13/726,408

(22) Filed: Dec. 24, 2012

(65) Prior Publication Data

US 2014/0177115 A1 Jun. 26, 2014

(51) Int. Cl.
| | |
|---|---|
| *H02H 3/00* | (2006.01) |
| *H02J 7/00* | (2006.01) |
| *H05K 7/10* | (2006.01) |
| *H02H 7/18* | (2006.01) |
| *H02H 11/00* | (2006.01) |
| *H01M 2/10* | (2006.01) |
| *H01M 10/42* | (2006.01) |
| *H01M 10/44* | (2006.01) |
| *H01M 10/46* | (2006.01) |
| *H01M 10/48* | (2006.01) |
| *H02H 5/04* | (2006.01) |

(52) U.S. Cl.
CPC .......... *H02J 7/0045* (2013.01); *H01M 2/1055* (2013.01); *H01M 10/4257* (2013.01); *H01M 10/441* (2013.01); *H01M 10/46* (2013.01); *H01M 10/482* (2013.01); *H01M 10/486* (2013.01); *H02H 7/18* (2013.01); *H02H 11/00* (2013.01); *H05K 7/10* (2013.01); *H02H 5/04* (2013.01); *H02J 7/0013* (2013.01)

(58) Field of Classification Search
USPC .......................................... 307/87
See application file for complete search history.

(56) References Cited

U.S. PATENT DOCUMENTS

| | | | | | |
|---|---|---|---|---|---|
| 5,854,549 | A | * | 12/1998 | Paulick ............... | H01M 2/105 320/110 |
| 6,459,175 | B1 | * | 10/2002 | Potega ................. | B60L 11/185 307/132 M |
| 6,586,850 | B1 | * | 7/2003 | Powers ................ | A61N 1/3975 307/150 |
| 2002/0060550 | A1 | * | 5/2002 | Pautet ................. | H01M 10/1055 320/103 |
| 2007/0216354 | A1 | * | 9/2007 | Taylor .................. | H01M 6/425 320/128 |
| 2011/0200375 | A1 | * | 8/2011 | Kokawa ................ | B41J 3/4075 400/578 |
| 2012/0268069 | A1 | * | 10/2012 | Park .................... | H01M 10/4207 320/116 |
| 2014/0177115 | A1 | * | 6/2014 | Gojenola ............ | H01M 2/1055 361/87 |
| 2014/0239895 | A1 | * | 8/2014 | Arendell ............. | H01M 2/1005 320/112 |

\* cited by examiner

*Primary Examiner* — Ronald W Leja
(74) *Attorney, Agent, or Firm* — Kilpatrick Townsend & Stockton LLP

(57) ABSTRACT

One embodiment of the invention is directed to a rechargeable battery pack configured to provide power to a device that also accepts at least one standard non-rechargeable battery. The rechargeable battery pack comprises a housing for housing at least one battery cell and recharging circuitry. The at least one battery cell and the recharging circuitry is be housed substantially within the housing. The recharging circuitry is coupled with the at least one battery cell. The recharging circuitry is configured to charge the at least one battery cell when the battery pack is inserted into the device that also accepts at least one non-rechargeable battery. The rechargeable battery back further comprises a protection circuit coupled with the recharging circuitry.

20 Claims, 17 Drawing Sheets

RECHARGEABLE BATTERY

BACKGROUND

Removable rechargeable batteries are used for many devices today. For example, typical removable rechargeable batteries may include Nickel Metal Hydride or Nickel Cadmium batteries in many sizes such as AA, AAA, etc. To recharge removable rechargeable batteries, the batteries must be removed from a device and placed in a separate external charger and plugged into an electrical outlet to be charged. Once they are charged, they can be removed from the external charger and put back into the device to use the device. This requires the user to purchase a separate charging unit to be able to charge the removable rechargeable batteries. A separate charging unit can be particularly inconvenient for portable devices users since it requires the user to carry around the separate charging unit to be able to charge the portable device on the go.

Another example of a rechargeable battery is a non-removable rechargeable battery. Since the non-removable battery cannot be removed from the device, the charging circuitry is built directly into the device to charge the non-removable battery. Building the charging circuitry directly into the device adds additional cost to the device and takes up additional space in the device.

Embodiments of the invention address these and other issues, individually and collectively.

BRIEF SUMMARY

Embodiments of the invention are directed to a rechargeable battery pack that can be inserted into the same compartment of a device as standard batteries (e.g., non-rechargeable AA batteries, non-rechargeable AAA batteries, etc.). In embodiments of the invention the battery pack includes recharging circuitry in the battery pack itself.

One embodiment of the invention is directed to a rechargeable battery pack configured to provide power to a device that also accepts at least one standard non-rechargeable battery. The rechargeable battery pack comprises a housing for housing at least one battery cell and recharging circuitry. The at least one battery cell and the recharging circuitry is housed substantially within the housing. The recharging circuitry is coupled with the at least one battery cell. The recharging circuitry is configured to charge the at least one battery cell when the battery pack is inserted into the device that also accepts at least one non-rechargeable battery. The rechargeable battery pack further comprises a protection circuit coupled with the recharging circuitry.

Another embodiment of the invention is directed to an electronic device configured to receive power from either at least one standard battery or at least one rechargeable battery pack. The electronic device comprises a housing, and at least one compartment in the housing. The at least one compartment is configured to receive either the at least one standard battery or the at least one rechargeable battery pack. The electronic device further comprises a pin connector on the housing, the pin connector comprising at least one pin. The pin connector is configured to receive at least one contact on the at least one rechargeable battery pack when the at least one rechargeable battery pack is inserted into the at least one compartment.

Another embodiment of the invention is directed to a system comprising an electronic device and a master rechargeable battery pack. The electronic device comprises a housing and at least one compartment in the housing. The at least one compartment is configured to receive either the at least one standard battery or at least one master rechargeable battery pack. The master rechargeable battery pack comprises a housing for housing at least one master battery cell and recharging circuitry. The at least one master battery cell and the recharging circuitry are housed substantially within the housing. The recharging circuitry is coupled with the at least one master battery cell and the recharging circuitry is configured to charge the at least one master battery cell when the master rechargeable battery pack is inserted into the device.

These and other embodiments are described in further detail below.

DETAILED DESCRIPTION

Embodiments of the invention provide a battery pack that can be inserted into the same compartment of a device as standard batteries (e.g., non-rechargeable AA batteries, non-rechargeable AAA batteries, etc.). Embodiments of the invention provide a battery pack that includes recharging circuitry in the battery pack itself.

Embodiments of the invention provide for many advantages. For example, typical devices that accept non-removable rechargeable batteries require recharging circuitry in the device and devices that accept removable rechargeable batteries require a separate external charger that must be used to charge the rechargeable batteries outside of the device. This adds additional cost and takes up additional space in the device or requires the user to purchase an external charger and remove the batteries to charge them. Embodiments of the invention minimize the cost associated with the device because only minor modification to the device may be necessary and a user can either use standard batteries or the rechargeable battery pack. This is advantageous to the user because it provides an accessory solution for users of a device who desire to use rechargeable batteries in the device and does not require additional cost for the device for users who do not wish to use rechargeable batteries with the device. This is also advantageous to the manufacturer of the device because it lowers the cost of the device and saves space and weight in the device.

In addition, embodiments of the invention provide protection mechanisms to keep the product safe, as explained in further detail below. The safety mechanism may be included in the battery pack itself to reduce cost of the base device. The protection mechanisms detect whether a standard (non-rechargeable) battery or a rechargeable battery pack is in the device to make sure to charge only the rechargeable battery pack and provide safety mechanisms against charging a standard battery (which could leak or vent). In addition, embodiments of the invention provide additional safety mechanism between the battery cells.

Accordingly, embodiments of the invention provide a rechargeable battery pack that includes charging circuitry inside the battery pack and that is in a form factor to fit in the same compartment of a device as standard non-rechargeable batteries (e.g., AA batteries).

Figure 1A:
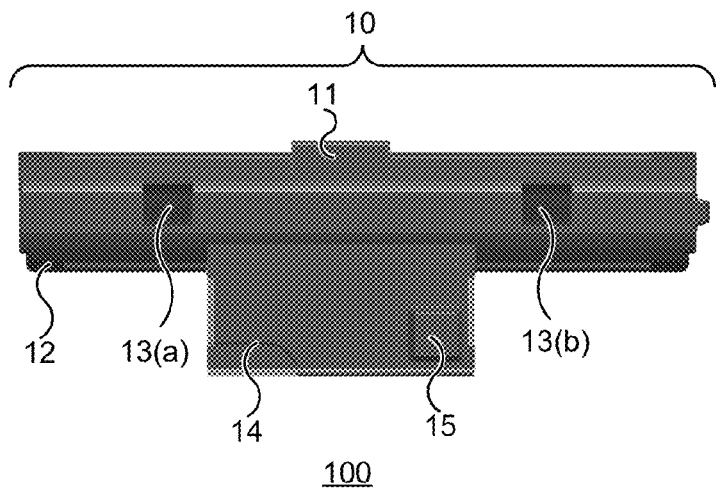
FIG. 1A shows a top view of a battery pack according to embodiments of the invention.

FIG. 1A shows a top view of a battery pack 100 according to an embodiment of the invention. The battery pack 100 may be in a form to fit into a battery compartment of a device that also accepts standard batteries. For exemplary purposes, the battery pack 100 is shown in the form of two AA batteries lying end to end. And thus, the battery pack 100 is in a form to fit into a compartment of a device that also fits two standard AA batteries. It is understood that different forms may be used for the battery pack 100 depending on the form necessary to fit in the device. For example, a device may require just one AA battery, two AA batteries side by side, two AA batteries end to end, or four AAA batteries, etc. Accordingly, the battery pack 100 may be in the form of one AA battery, two AA batteries side by side, two AA batteries end to end, four AAA batteries, etc.

The battery pack 100 in FIG. 1A includes a housing 10 for housing at least one battery cell and recharging circuitry. The at least one battery cell and the recharging circuitry may be housed substantially within the housing. A battery cell is shaped the same size as a standard battery (e.g., an AA battery). The housing may be made of a plastic or other suitable substrate. For exemplary purposes, housing 10 is configured to house two battery cells in the form of two AA batteries lying end to end. The housing 10 may comprise a main body housing 12 for housing the at least one battery cell, coupled with a recharging circuitry housing 14 for housing recharging circuitry for the at least one battery cell.

Figure 8:
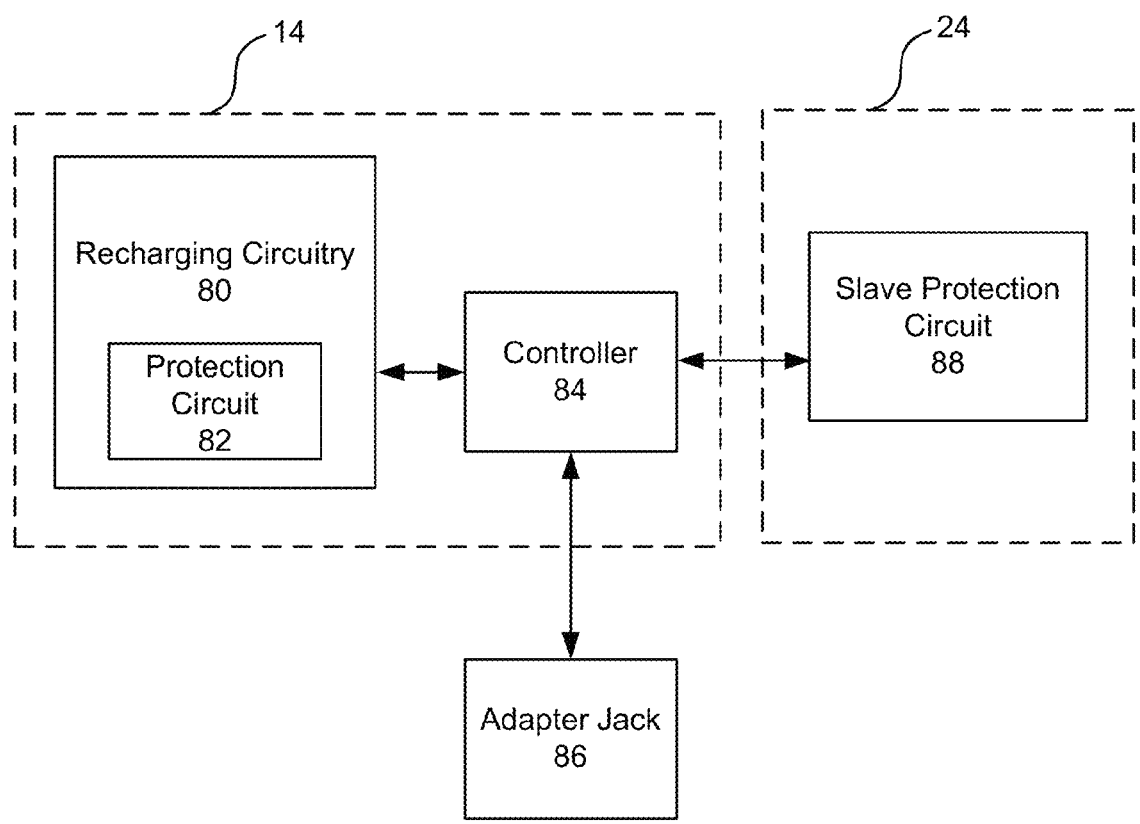
FIG. 8 shows recharging circuitry according to embodiments of the invention.

As shown in FIG. 8, the recharging circuitry housing 14 may house recharging circuitry 80 and a protection circuit 82. The recharging circuitry may determine whether to charge the battery pack 100 and any optional additional battery packs. The protection circuit 82 may contain sensors such as temperature sensors. For example, it may be important to determine that the battery cell temperature is in the correct range to charge the battery cell (e.g., not too hot or too cold before beginning to charge) because the battery cell may not charge in circumstances where it is too hot or too cold. For example, if it is already very hot, charging will make it hotter and adding heat to the battery cell may change the chemicals and the way the battery cell behaves. Accordingly, the temperature sensors can tell the recharging circuitry 80 whether it is safe to charge or not. Individual temperature sensors may be used for each battery pack. The protection circuitry may additionally detect when the one or more battery cell(s) is fully charged so that the battery pack can stop charging the one or more battery cell.

The recharging circuitry housing 14 may also optionally house a controller 84. The optional controller 84 may be in operative communication with the recharging circuitry 80, the protection circuit 82 and temperature sensors. The controller 84 may be in operative communication with an adapter jack 86 on a device when the battery pack 100 is installed in the device.

The controller 84 may also be in operative communication with one or more additional battery packs such as a slave battery pack (e.g., a slave protection circuit 88) if one or more slave battery packs is necessary. For example, the controller 84 may be in operative communication with slave battery pack 200 described below. For example, the controller 84 may receive sensor information from the slave protection circuit 88 and then communicate the information to the recharging circuit 80. The slave battery pack is optional. There may be one or more slave battery packs or no slave battery packs. In the case where there is only a master battery pack 100 (i.e., no slave battery pack(s)), the controller 84 may be optional.

The temperature sensors in the protection circuit 82 may send signals to the recharging circuitry 80 so that the recharging circuitry 80 may determine whether to begin charging the at least one battery cell, continue charging the battery cell, or terminate charging of the battery cell. The recharging circuitry 80 and/or the controller 84 may detect when the device is plugged into an external power supply through the adapter jack 86 so that the recharging circuitry 80 can determine whether to start charging the battery cell. The recharging circuitry 80 and/or the controller 84 can disconnect the external source from the recharging circuitry 80 to terminate charging of the battery cell or detect when the device is unplugged from an external power supply.

As an additional safety mechanism, the device itself may contain a device controller that may receive signals from the temperature sensors in the protection circuit 82 and/or slave protection circuit 88 to determine whether or not to continue supplying power from the external power supply. In the case where the battery pack 100 may not sense that the temperature is too hot or too cold, the device controller may receive signals from the temperature sensors in the protection circuit 82 and/or slave protection circuit 88 and determine if the temperature is too hot or too cold, and may disconnect the main AC jack source from the recharging circuitry 80.

As yet an additional safety mechanism, a separate protection device (e.g., a PTC protection device) may be included between the battery cells. The protection device may be in the form of a disc that fits between the battery cells. This protection device may be purely a mechanical solution that does not require a controller. The protection device may be similar to a fuse and may monitor both current and temperature. The current is conducted though the protection device as long as the current and the temperature are not too high. If the current and temperature are too high, then the protection device opens the circuit so that there is no more current flowing between the battery cells.

This provides an additional safety measure. Standard rechargeable batteries do not have this type of protection.

If the recharging circuitry 80 and protection circuit 82 need a bit more room, a portion of the recharging circuitry housing 14 may be raised to allow for a taller component in the recharging circuitry or protection circuit as shown in FIG. 1A portion 15).

Referring again to FIG. 1A, the housing 10 may optionally include a tab 11 to allow easy removal of the battery pack. For example, the device may have a finger scoop that aligns with the tab 11 so that a user can easily remove the battery pack. The housing 10 may also include one or more indentations 13(a) and 13(b) that may align with foam pads included on the battery compartment door of the device to more securely hold batteries in place in the device. The one or more indentations 13(a) and 13(b) may be cut outs in the housing 10 that allow the foam pads on the battery compartment door of the device to contact the at least one battery cell. This may help with compatibility with the battery compartment of the device in the case where there are one or more standard batteries instead of the battery pack 100 if the battery pack 100 is slightly larger than one or more standard batteries. The one or more indentation 13(a) and 13(b) may be unnecessary if the battery pack 100 is substantially the same size as the standard batteries.

Figure 1B:
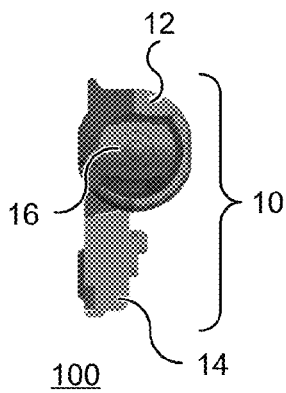
FIG. 1B shows an end view of a battery pack according to embodiments of the invention.

FIG. 1B shows an end view of a battery pack 100 according to embodiments of the invention. The battery pack includes a housing 10 for housing at least one battery cell 16 and recharging circuitry. The portion of the battery cell 16 showing in FIG. 1B may be the positive terminal that has the positive polarity. The housing 10 may comprise a main body housing 12 for housing the at least one battery cell 16, and a recharging circuitry housing 14 for housing recharging circuitry for the at least one battery cell 16. The recharging circuitry housing 14 may also house a protection circuit and an optional controller as explained above.

Figure 1C:
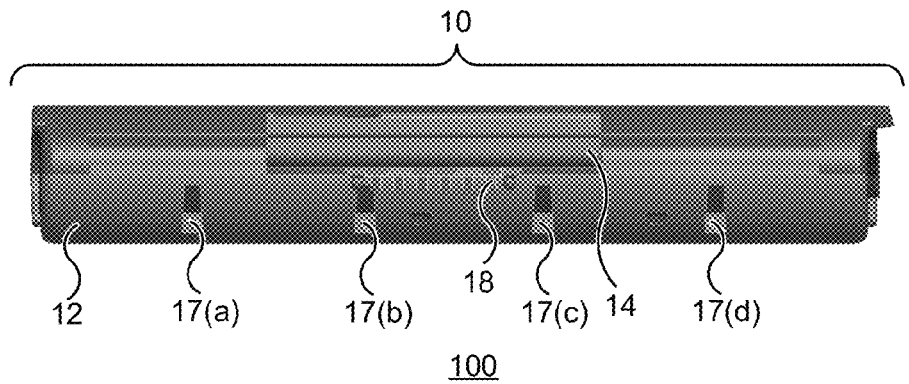
FIG. 1C shows a side view of a battery pack according to embodiments of the invention.

FIG. 1C shows a side view of a battery pack 100 according to embodiments of the invention. As explained in further detail above, the battery pack 100 may include a housing 10 for housing at least one battery cell and recharging circuitry. The housing 10 may comprise a main body housing 12 for housing the at least one battery cell, and a recharging circuitry housing 14 for housing recharging circuitry for the at least one battery cell. The recharging circuitry housing 14 may also house a protection circuit and an optional controller as explained above. The battery pack 100 may also include one or more slots 17(a)-17(d). The battery compartment of the device may contain one or more ribs that support standard batteries. One or more slots 17(a)-17(b) may align with such ribs.

The battery pack 100 may also include one or more contacts 18. Contacts 18 may be spring contacts that give when they are pushed in. The one or more contacts 18 may be configured to be coupled with connectors on a device as explained in further detail below.

Figure 1D:
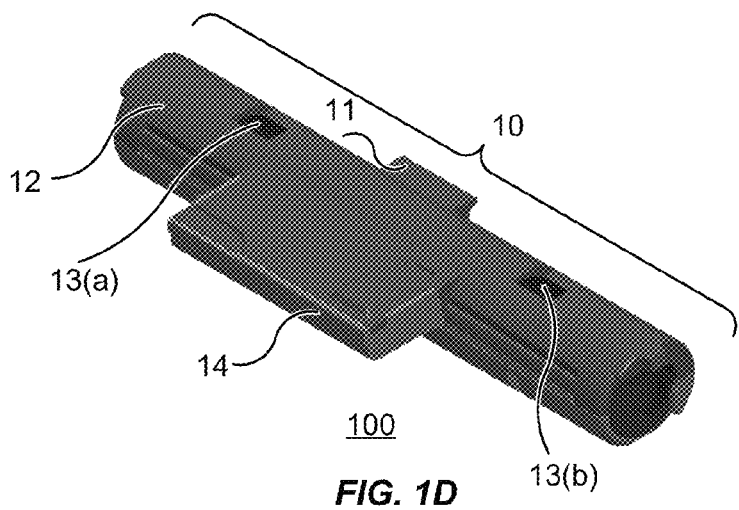
FIG. 1D shows a perspective view of a battery pack according to embodiments of the invention.

FIG. 1D shows a perspective view of a battery pack 100 according to embodiments of the invention. As explained in further detail above, the battery pack 100 may include a housing 10 for housing at least one battery cell and recharging circuitry. The housing 10 may comprise a main body housing 12 for housing the at least one battery cell, and a recharging circuitry housing 14 for housing recharging circuitry for the at least one battery cell. The recharging circuitry housing 14 may also house a protection circuit. The housing 10 may also include one or more indentations 13(a) and 13(b) that may align with foam pads included on the battery compartment door of the device to more securely hold batteries in place in the device. The one or more indentations 13(a) and 13(b)) may be cut outs in the housing 10 that allow the foam pads on the battery compartment door of the device to contact the at least one battery cell. This may help with compatibility with the battery compartment of the device in the case where there are one or more standard batteries instead of the battery pack 100 if the battery pack 100 is be slightly larger than one or more standard batteries. The one or more indentation 13(a) and 13(b) may be unnecessary if the battery pack 100 is substantially the same size as the standard batteries.

The housing 10 may optionally include a tab 11 to allow easy removal of the battery pack. For example, the device may have a finger scoop that aligns with the tab 11 so that a user can easily remove the battery pack.

Embodiments of the invention may include just one battery pack or may include one or more battery packs. In those embodiments, the battery pack 100 in FIGS. 1A-1D may be a master battery pack. The master battery pack 100 may be in operative communication with one or more slave battery packs.

Figure 2A:
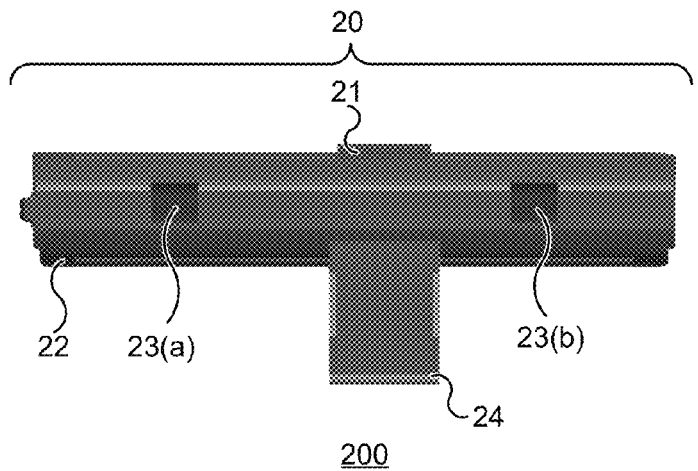
FIG. 2A shows a top view of a battery pack according to embodiments of the invention.

For example, FIGS. 2A-2D may be a slave battery pack. FIG. 2A shows a top view of a battery pack 200 according to an embodiment of the invention. For exemplary purposes, the battery pack 200 is shown in the form of two AA batteries lying end to end. It is understood that different shapes may be used depending on the shape necessary to fit in the device. For example, a device may require just one AA battery, two AA batteries side by side, two AA batteries end to end, or four AAA batteries, etc. Accordingly, the battery pack 100 may be in the form of one AA battery, two AA batteries side by side, two AA batteries end to end, four AAA batteries, etc.

The battery pack 200 in FIG. 2A includes a housing 20 for housing at least one battery cell and a protection circuit. The at least one battery cell and the protection circuit may be housed substantially within the housing 20. The housing may be made of a plastic or other suitable substrate. For exemplary purposes, housing 20 is configured to house two battery cells in the form of two AA batteries lying end to end. The housing 20 may comprise a main body housing 22 for housing the at least one battery cell, and a protection circuit housing 24 for housing a protection circuit.

As shown in FIG. 8, the protection circuit housing 24 may house slave protection circuit 88. The protection circuit 88 may contain may contain sensors such as temperature sensors. For example, it may be important to determine that the battery cell temperature is in the correct range to charge the battery cell (e.g., not too hot or too cold before beginning to charge) because the battery cell may not charge in circumstances where it is too hot or too cold. For example, if it is already very hot, charging will make it hotter and adding heat to the battery cell may change the chemicals and the way the battery cell behaves. Accordingly, the temperature sensors can tell the recharging circuitry 80 whether it is safe to charge or not. Individual temperature sensors may be used for each battery pack. The protection circuitry may additionally detect when the one or more battery cell(s) is fully charged so that the battery pack can stop charging the one or more battery cell.

The slave protection circuit 88 may be in operative communication with a controller 84 of a master battery pack. For example, the slave protection circuit 88 may be in operative communication with the master battery pack 100 as explained above.

The temperature sensors in the slave protection circuit 88 send signals to the controller 84 and the controller 84 may send the signals to the recharging circuitry 80 so that the recharging circuitry 80 can determine whether to begin charging the at least one battery cell, continue charging the battery cell, or terminate charging of the battery cell. The controller 84 can also detect when the device is plugged into an external power supply through the adapter jack 86 and send the information to the recharging circuitry 80 so that the recharging circuitry 80 can determine whether to start charging the battery cell. The recharging circuitry 80 and/or the controller 84 can disconnect the external source from the recharging circuitry 80 to terminate charging of the battery cell or detect when the device is unplugged from an external power supply.

As an additional safety mechanism, the device itself may contain a device controller that may receive signals from the temperature sensors in the protection circuit 82 and/or slave protection circuit 88 to determine whether or not to continue supplying power from the external power supply. In the case where the battery pack 100 does not sense that the temperature is too hot or too cold, the device controller may receive signals from the temperature sensors in the protection circuit 82 and/or slave protection circuit 88 and determine if the temperature is too hot or too cold, and may disconnect the main AC jack source from the recharging circuitry 80.

As yet an additional safety mechanism, a separate protection device (e.g., a PTC protection device) may be included between the battery cells. The protection device may be in the form of a disc that fits between the battery cells. This protection device may be purely a mechanical solution that does not require a controller. The protection device may be similar to a fuse and may monitor both current and temperature. The current is conducted though the protection device as long as the current and the temperature are not too high. If the current and temperature are too high, then the protection device opens the circuit so that there is no more current flowing between the battery cells. This provides an additional safety measure. Standard rechargeable batteries do not have this type of protection.

Referring again to FIG. 2A, the housing 20 may further include a tab 21 to allow easy removal of the battery pack. For example, the device may have a finger scoop that aligns with the tab 21 so that a user can easily remove the battery pack. The housing 20 may also include one or more indentations 23(*a*) and 23(*b*) that may align with foam pads included on the battery compartment door of the device to more securely hold batteries in place in the device. The indentations 23(*a*) and 23(*b*) may be cut outs in the housing 20 that allow the foam pads on the battery compartment door of the device to contact the at least one battery cell. This may help with compatibility with the battery compartment of the device in the case where there are one or more standard batteries instead of the battery pack 200. The battery pack 200 may be slightly larger than one or more standard batteries. The one or more indentation 23(*a*) and 23(*b*) may be unnecessary if the battery pack 200 is substantially the same size as the standard batteries.

Figure 2B:
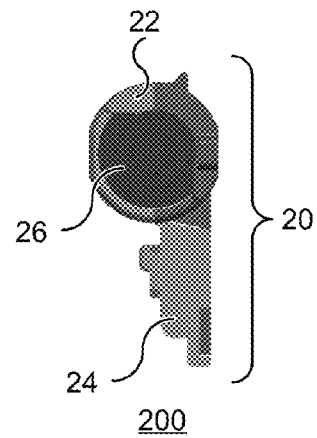
FIG. 2B shows an end view of a battery pack according to embodiments of the invention.

FIG. 2B shows an end view of a battery pack 200 according to embodiments of the invention. The battery pack includes a housing 20 for housing at least one battery cell 26 and a protection circuit. The portion of the battery cell 26 showing in FIG. 2B may be the positive terminal that has the positive polarity. The housing 20 may comprise a main body housing 22 for housing the at least one battery cell 26, and a protection circuit housing 24 for housing a protection circuit, as explained above.

Figure 2C:
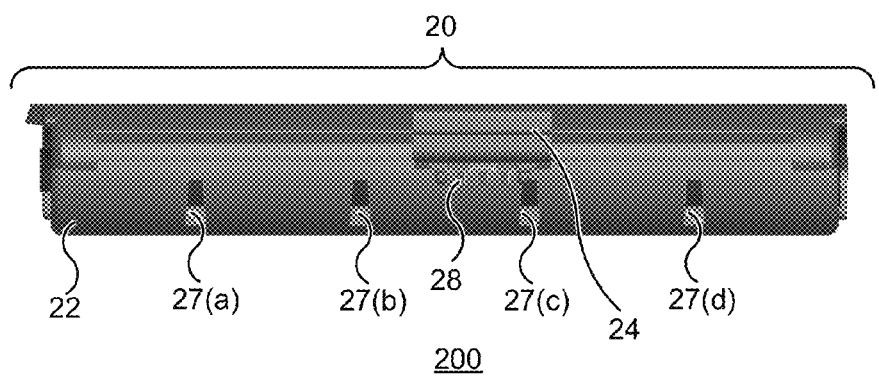
FIG. 2C shows a side view of a battery pack according to embodiments of the invention.

FIG. 2C shows a side view of a battery pack 200 according to embodiments of the invention. As explained in further detail above, the battery pack 200 may include a housing 20 for housing at least one battery cell and protection circuit. The housing 20 may comprise a main body housing 22 for housing the at least one battery cell, and a protection circuit housing 24 for housing a protection circuit. The battery pack 200 may also include slots 27(*a*)-27(*d*). The battery compartment of the device may contain ribs that hold up standard batteries. Slots 27(*a*)-27(*b*) may align with such ribs.

The battery pack 200 may also include one or more contacts 28. Contacts 28 may be spring contacts that give when they push in. The one or more contacts 28 may be configured to be coupled with connectors on a device as explained below.

Figure 2D:
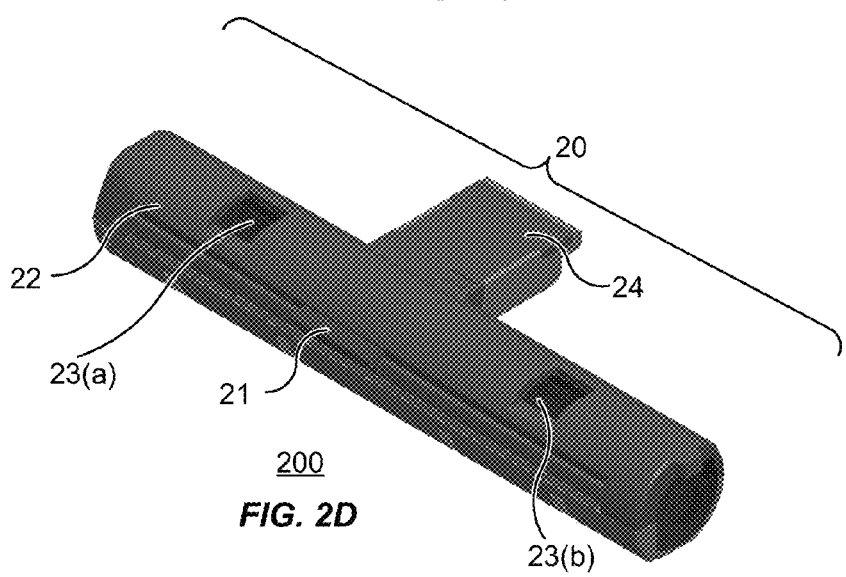
FIG. 2D shows a perspective view of a battery pack according to embodiments of the invention.

FIG. 2D shows a perspective view of a battery pack 200 according to embodiments of the invention. As explained in further detail above, the battery pack 200 may include a housing 20 for housing at least one battery cell and a protection circuit.

The housing 20 may comprise a main body housing 22 for housing the at least one battery cell, and a protection circuit housing 24 for housing a protection circuit. The housing 10 may also include one or more indentations 23(*a*) and 23(*b*) that may align with foam pads included on the battery compartment door of the device to more securely hold batteries in place in the device. The indentations 23(*a*) and 23(*b*) may be cut outs in the housing 20 that allow the foam pads on the battery compartment door of the device to contact the at least one battery cell. This may help with compatibility with the battery compartment of the device in the case where there are one or more standard batteries instead of the battery pack 200 if the battery pack 200 is slightly larger than one or more standard batteries. The one or more indentation 23(*a*) and 23(*b*) may be unnecessary if the battery pack 200 is substantially the same size as the standard batteries.

The housing 20 may optionally include a tab 21 to allow easy removal of the battery pack. For example, the device may have a finger scoop that aligns with the tab 21 so that a user can easily remove the battery pack.

Figure 3:
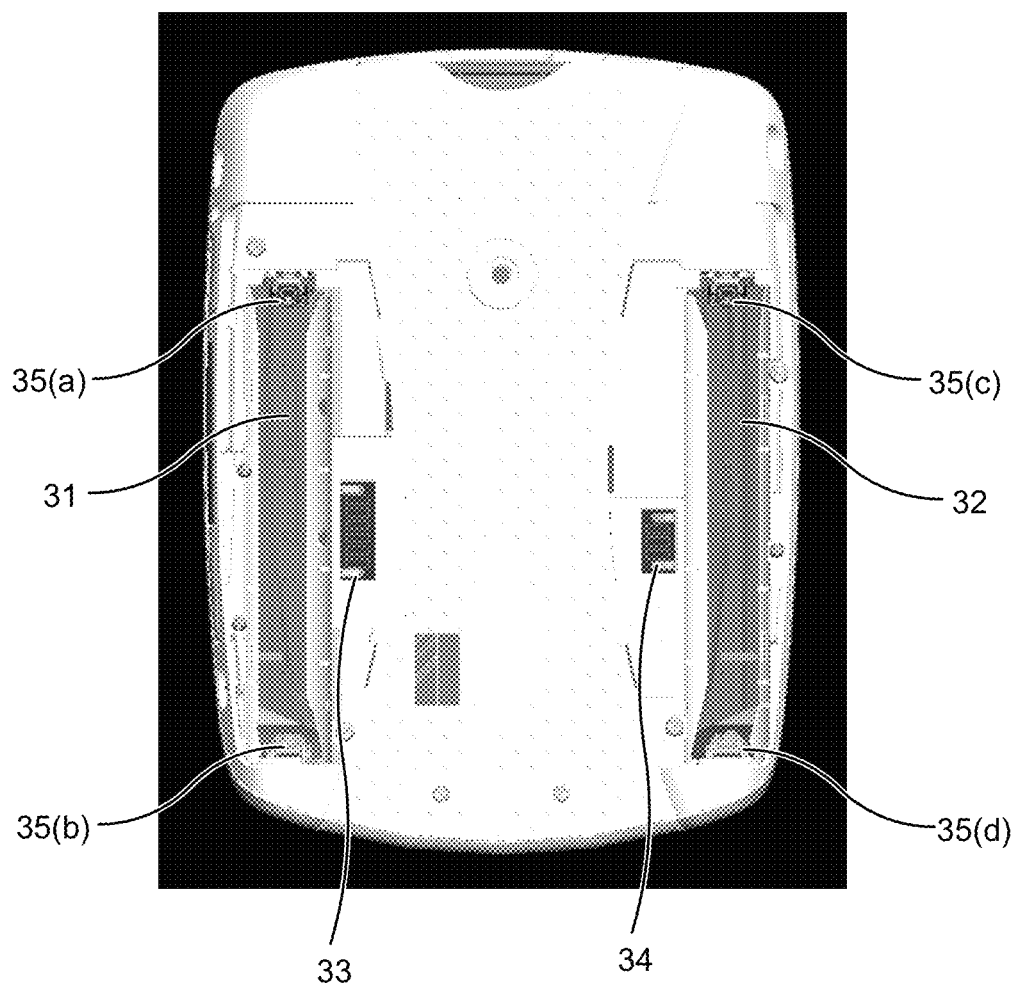
FIGS. 3-7 show a device configured to receive a battery pack according to embodiments of the invention.

FIG. 3 shows a device 30 configured to receive at least one battery pack according to embodiments of the invention. For exemplary purposes, FIG. 3 shows a left compartment 31 and a right compartment 32. The left compartment 31 may be configured to hold a first battery pack 100. The right compartment 32 may be configured to hold a second battery pack 200. It is understood that a device 30 could have a single compartment or more than two compartments depending on the needs of the device. The one or more compartments can also be located in any space on the device 30. For example, the left compartment 31 and right compartment 32 may be located on each side of the device to balance the weight in the product. By not putting a compartment in the middle of the device 30, the product may be thinner if most of the other components are in the middle of the product. A device that has a more balance weight may provide for a better user experience. For example, the device 30 may be a mobile device that is typically held in the user's hand when in use. In another example, the user of the device 30 may be a child and a device with a more balanced weight may be easier to handle by a child.

The left compartment 31 and the right compartment 32 may each be configured to hold standard batteries. In the exemplary device in FIG. 3 the left compartment 31 and the right compartment 32 may each be configured to hold two AA batteries lying end to end. Accordingly, the device 30 may receive either standard batteries or rechargeable battery packs.

The left compartment may be configured to hold a master battery pack 100 that contains recharging circuitry and a protection circuit and the right compartment may be configured to hold a slave battery pack 200 that contains a protection circuit.

The device 30 also includes a left pin connector 33 and a right pin connector 34. It is understood that the left pin connector 33 and the right pin connector 34 may have any number of pins necessary to receive contacts on a battery pack 100 or battery pack 200. For example, the left pin connector 33 may be a six-pin connector and the right side connector 34 may be a three pin connector. The left pin connector 33 may be configured to receive contacts on a master battery pack 100. For example, the master battery pack 100 may have contacts on the recharging circuitry housing 14. When the master battery pack 100 is installed in the left compartment 31, the contacts touch the left pin connector 33 and a connection is made between the recharging circuit, or the protection circuit, and the device 30. The master battery pack 100 contacts may be spring contacts that are compressible contact (e.g., give when pushed in) to ensure a good fit. For example, when the master battery pack 100 is fully installed, the spring contacts are meant to give by a certain amount (e.g., millimeters) to ensure that the spring contacts are engaged with the left pin connector 33. It may be preferable to have the spring contacts on the battery pack 100 and the connectors on the device to remove the cost of the contacts from the device and put the cost of the contacts in the battery pack 100.

The slave battery pack 200 may have fewer contacts because the slave battery pack 200 may include a protection circuit and not a recharging circuit. For example, the slave battery pack 200 may have contacts on the protection circuit housing 24. When the slave battery pack 200 is installed in the right compartment 32, the contacts touch the right pin connector 34 and a connection is made between the protection circuit and the device 30. The slave battery pack 200 contacts may be spring contacts that are compressible contacts (e.g., give when pushed in) to ensure a good fit. For example, when the slave battery pack 200 is fully installed the spring contacts are meant to give by a certain amount (e.g., millimeters) to ensure that the spring contacts are engaged with the right pin connector 34. It may be preferable to have the contacts in the battery pack 200 and the connectors on the device to remove the cost of the spring contacts from the device and put the cost of the contacts in the battery pack 200.

The device may use connectors 33 and 34 to determine whether a battery pack is installed. If nothing is in contact with the connectors 33 or 34 then the device 30 knows that no battery packs are installed. If there is contact on either connectors 33 or 34 or both, then the device knows that there are battery packs installed in the left compartment or the right compartment or both. The device may optionally monitor the signals and sensors on the battery pack(s) to determine if the recharging circuitry is functioning properly, and may optionally remove power from the recharging circuitry as a precaution or extra safety feature.

The left compartment 31 and the right compartment 32 may have contacts 35(a)-35(d) to deliver power from the standard batteries or battery packs to the device when the standard batteries or battery packs are installed in the device.

Figure 4:
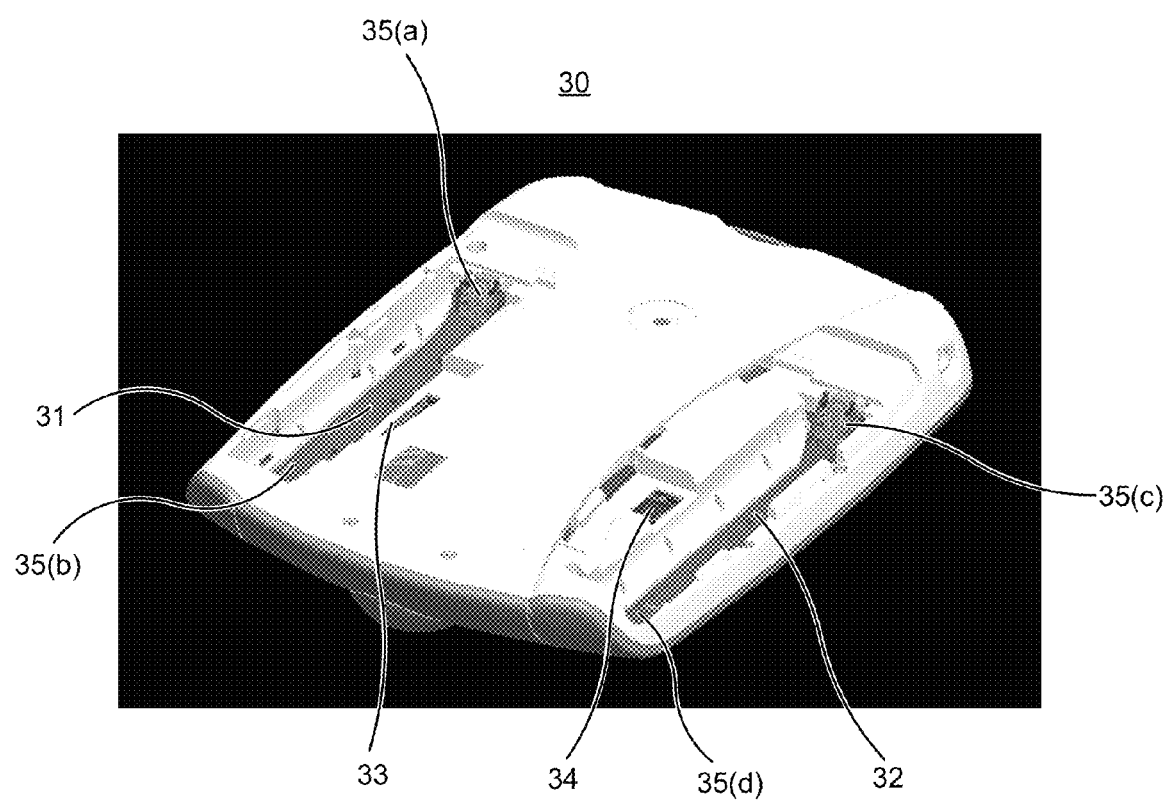
Figure 5:
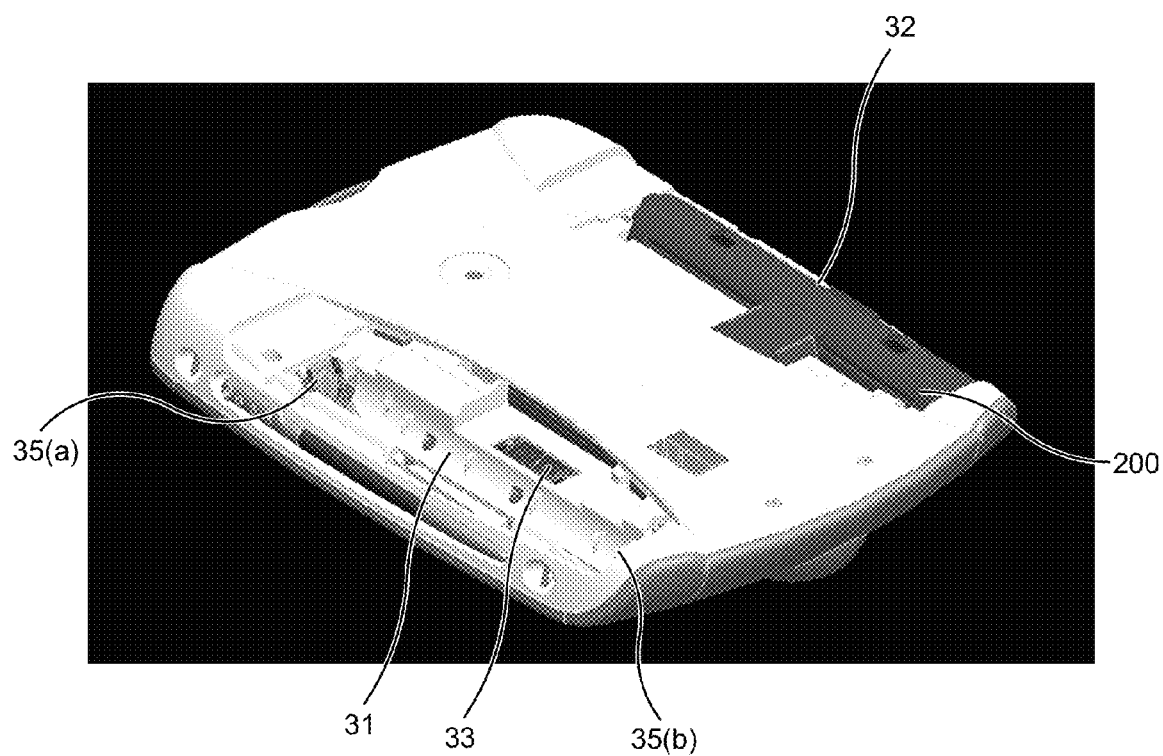

FIG. 4 is a perspective view of device 30. FIG. 5 is another perspective view of device 30 that shows a battery pack 200 installed in the right compartment 32.

Figure 6:
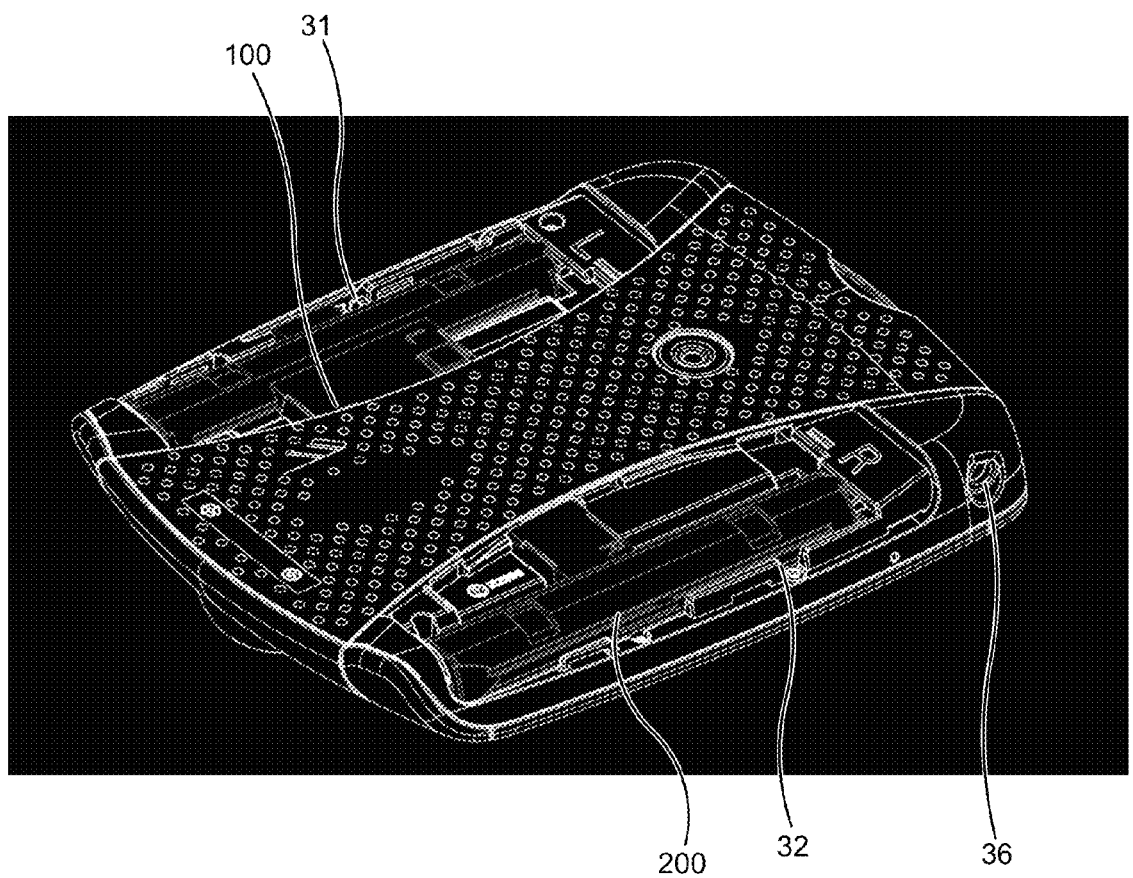

FIG. 6 is a perspective view of device 30 that shows battery pack 100 installed in the left compartment 31 and battery pack 200 installed in the right compartment 32. Adapter jack 36 may accept a power adapter plugged from adapter jack 36 into an external power source. It may be necessary for the device 30 to be plugged into power for the battery packs to be recharged when installed in the device 30.

For example, once the device 30 detects that a power source is available (e.g., the power adapter is plugged from the adapter jack 30 into a power source), then the device 30 may check that both battery packs are installed. It may be necessary for both battery packs to be installed to charge the battery packs. The device 30 may also check to be sure the temperatures of the battery packs are correct before allowing the power from the power source to come into the recharging circuitry.

In addition, or in the alternative, the controller 84 in the master battery pack 100 may detect that a power source is available (e.g., the power adapter is plugged from the adapter jack 30 into a power source). The controller 84 may then check that both battery packs are installed. It may be necessary for both battery packs to be installed to charge the battery packs. If the master battery pack 100 is installed and one or more slave battery packs is required, the controller 84 may ensure that the temperature sensors from the one or more slave battery packs is responding before it lets the recharging circuitry 80 start charging. If one or more slave battery packs is required, but not installed, the recharging circuitry 80 in the master battery pack 100 will not receive signals from the controller 84 to start charging. The controller 84 may also check to be sure the temperatures of the battery packs are correct before allowing the power from the power source to come into the recharging circuitry.

In the case where there is only one battery pack 100, the controller 84 may be optional. The recharging circuitry 80 of the master battery pack 100 may detect that a power source is available (e.g., the power adapter is plugged from the adapter jack 30 into a power source). The recharging circuitry 80 of the master battery pack 100 may then check that both battery packs are installed. It may be necessary for both battery packs to be installed to charge the battery packs. If the master battery pack 100 is installed and one or more slave battery packs is required, the recharging circuitry 80 may ensure that the temperature sensors from the one or more slave battery packs is responding before it starts charging. If one or more slave battery packs is required, but not installed, the recharging circuitry 80 in the master battery pack 100 will not receive signals from the slave battery pack(s) to start charging. The recharging circuitry 80 of the master battery pack 100 may also check to be sure the temperatures of the battery packs are correct before allowing the power from the power source to come into the recharging circuitry.

Figure 7:
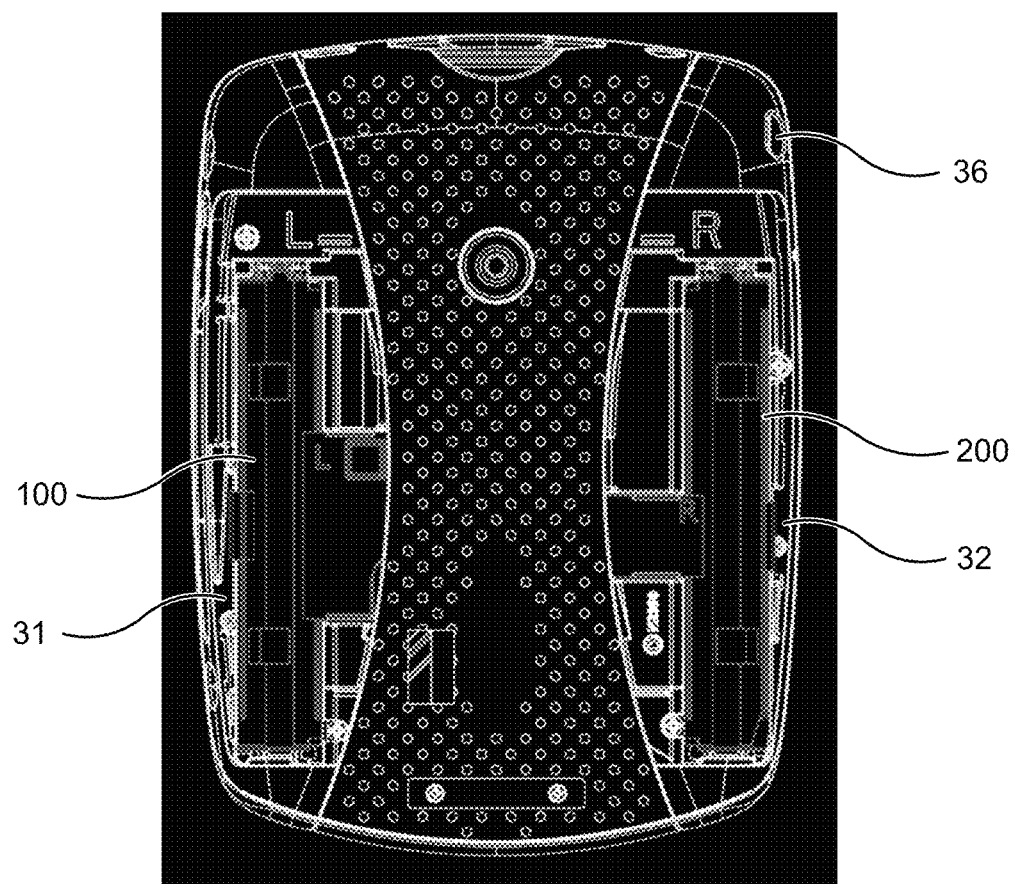

FIG. 7 shows another view of the device 30 that shows battery pack 100 installed in the left compartment 31 and battery pack 200 installed in the right compartment 32.

Figure 9A:
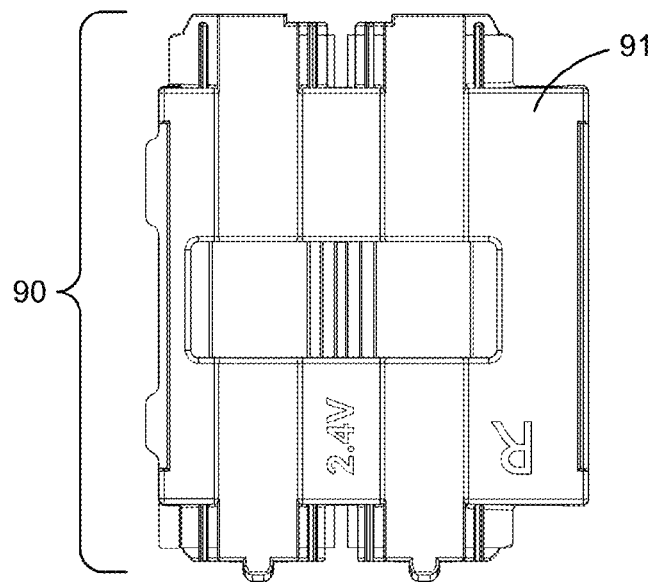
FIG. 9A shows a top view of a battery pack according to embodiments of the invention.

FIG. 9A shows a top view of a battery pack 300 according to an embodiment of the invention. The battery pack 300 may be in a form to fit into a battery compartment of a device that also accepts standard batteries. For exemplary purposes, the battery pack 300 is shown in the form of two AA batteries lying side by side. And thus, the battery pack 300 is in a form to fit into a compartment of a device that also fits two standard AA batteries. It is understood that different forms may be used for the battery pack 300 depending on the form necessary to fit in the device. For example, a device may require just one AA battery, two AA batteries side by side, two AA batteries end to end, or four AAA batteries, etc. Accordingly, the battery pack 300 may be in the form of one AA battery, two AA batteries side by side, two AA batteries end to end, four AAA batteries, etc.

The battery pack 300 in FIG. 9A includes a housing 90 for housing at least one battery cell and recharging circuitry. The at least one battery cell and the recharging circuitry may be housed substantially within the housing 90. A battery cell is shaped the same size as a standard battery (e.g., an AA battery). The housing may be made of a plastic or other suitable substrate. For exemplary purposes, housing 90 is configured to house two battery cells in the form of two AA batteries side by side. The housing 90 may comprise a main body housing for housing the at least one battery cell, coupled with a recharging circuitry housing 91 for housing recharging circuitry for the at least one battery cell.

As shown in FIG. 8, the recharging circuitry housing 91 (shown as 14) may house recharging circuitry 80 and a protection circuit 82. The recharging circuitry may determine whether to charge the battery pack 300 and any optional additional battery packs. The protection circuit 82 may contain sensors such as temperature sensors. For example, it may be important to determine that the battery cell temperature is in the correct range to charge the battery cell (e.g., not too hot or too cold before beginning to charge) because the battery cell may not charge in circumstances where it is too hot or too cold. For example, if it is already very hot, charging will make it hotter and adding heat to the battery cell may change the chemicals and the way the battery cell behaves. Accordingly, the temperature sensors can tell the recharging circuitry whether it is safe to charge or not. Individual temperature sensors may be used for each battery pack. The protection circuitry may additionally detect when the one or more battery cell is fully charged so that the battery pack can stop charging the one or more battery cell.

The recharging circuitry housing 91 (shown as 14) may also optionally house a controller 84. The optional controller 84 may be in operative communication with the recharging circuitry 80, the protection circuit 82 and temperature sensors. The controller 84 may be in operative communication with an adapter jack 86 on a device when the battery pack 300 is installed in the device. The controller 84 may also be in operative communication with one or more additional battery packs such as a slave battery pack (e.g., a slave protection circuit 88) if one or more slave battery packs is necessary. For example, the controller 84 may be in operative communication with slave battery pack 400 described below. For example, the controller 84 may receive sensor information from the slave protection circuit 88 and then communicate the information to the recharging circuit 80. The slave battery pack is optional. There may be one or more slave battery packs or no slave battery packs. In the case where there is only a master battery pack 300 (i.e., no slave battery pack(s)), the controller 84 may be optional.

The temperature sensors in the protection circuit 82 send signals to the recharging circuitry 80 so that the recharging circuitry 80 may determine whether to begin charging the at least one battery cell, continue charging the battery cell, or terminate charging of the battery cell. The recharging circuitry 80 and/or the controller 84 may detect when the device is plugged into an external power supply through the adapter jack 86 so that the recharging circuitry 80 can determine whether to start charging the battery cell. The controller 84 and/or the recharging circuitry 80 can disconnect the external source from the recharging circuitry 80 to terminate charging of the battery cell or detect when the device is unplugged from an external power supply.

As an additional safety mechanism, the device itself may contain a device controller that may receive signals from the temperature sensors in the protection circuit 82 and/or slave protection circuit 88 to determine whether or not to continue supplying power from the external power supply. In the case where the battery pack 300 does not sense that the temperature is too hot or too cold, the device controller may receive signals from the temperature sensors in the protection circuit 82 and/or slave protection circuit 88 and determine if the temperature is too hot or too cold, and may disconnect the main AC jack source from the recharging circuitry 80.

Figure 9B:
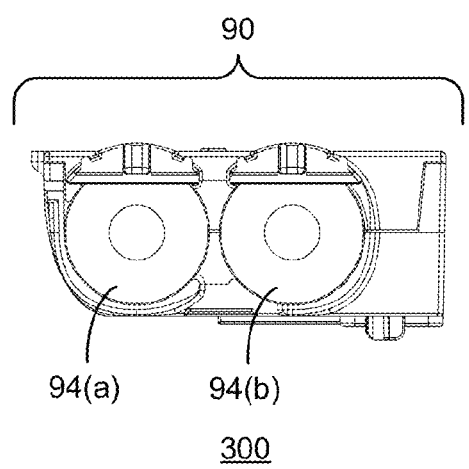
FIG. 9B shows an end view of a battery pack according to embodiments of the invention.

FIG. 9B shows an end view of a battery pack 300 according to embodiments of the invention. The battery pack includes a housing 90 for housing at least one battery cell 94(*a*) and/or 94(*b*) and recharging circuitry. The portion of the battery cell 94(*a*) and 94(*b*) showing in FIG. 9B may be the positive terminal that has the positive polarity. The housing 90 may comprise a main body housing for housing the at least one battery cell 94(*a*) and/or 94(*b*), and a recharging circuitry housing for housing recharging circuitry for the at least one battery cell 94(*a*) and/or 94(*b*). The recharging circuitry housing may also house a protection circuit and an optional controller as explained above.

Figure 9C:
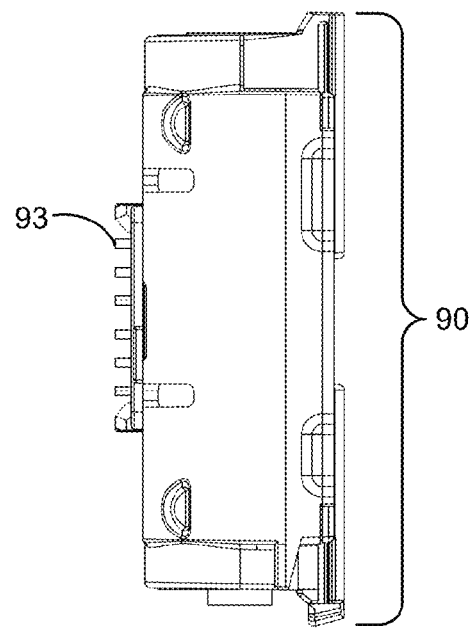
FIG. 9C shows a side view of a battery pack according to embodiments of the invention.

FIG. 9C shows a side view of a battery pack 300 according to embodiments of the invention. As explained in further detail above, the battery pack 300 may include a housing 90 for housing at least one battery cell and recharging circuitry. The housing 90 may comprise a main body housing for housing the at least one battery cell, and a recharging circuitry housing for housing recharging circuitry for the at least one battery cell. The recharging circuitry housing may also house a protection circuit and an optional controller.

The battery pack 300 may also include one or more contacts 93. Contacts 93 may be spring contacts that give when they are pushed in. The one or more contacts 93 may be configured to be coupled with connectors on a device as explained in further detail below.

Embodiments of the invention may include just one battery pack or may include one or more battery packs. In those embodiments, the battery pack 300 in FIGS. 9A-9C may be a master battery pack. The master battery pack 300 may be in operative communication with one or more slave battery packs.

Figure 10A:
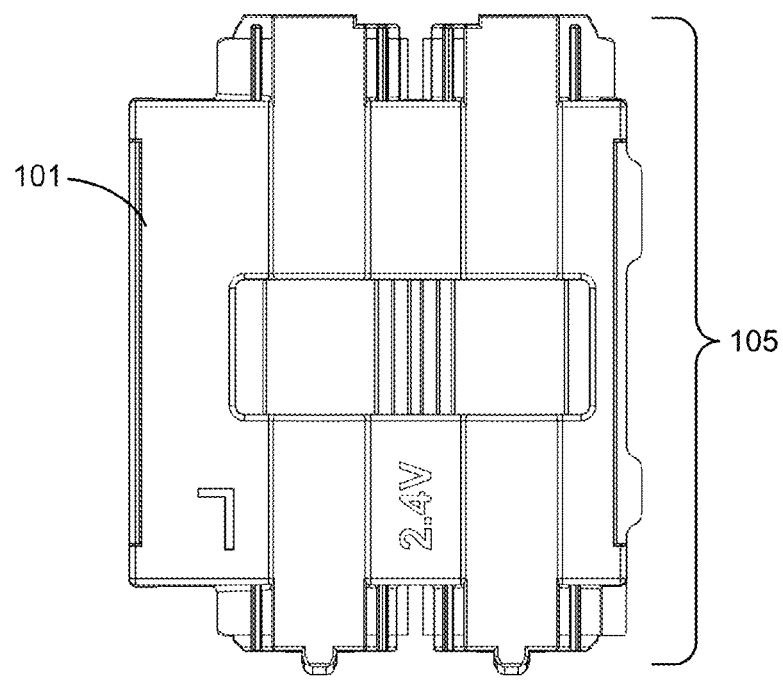
FIG. 10A shows a top view of a battery pack according to embodiments of the invention.
Figure 10B:
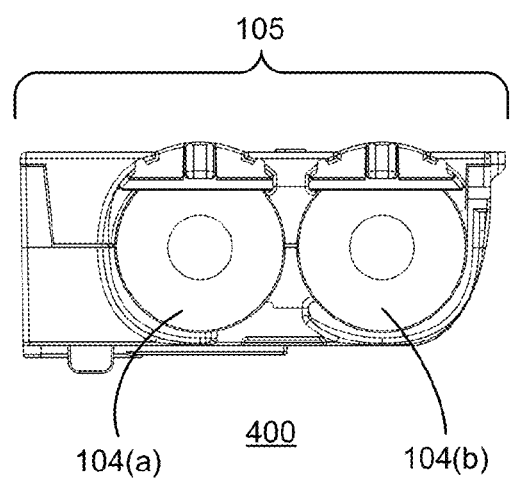
FIG. 10B shows an end view of a battery pack according to embodiments of the invention.
Figure 10C:
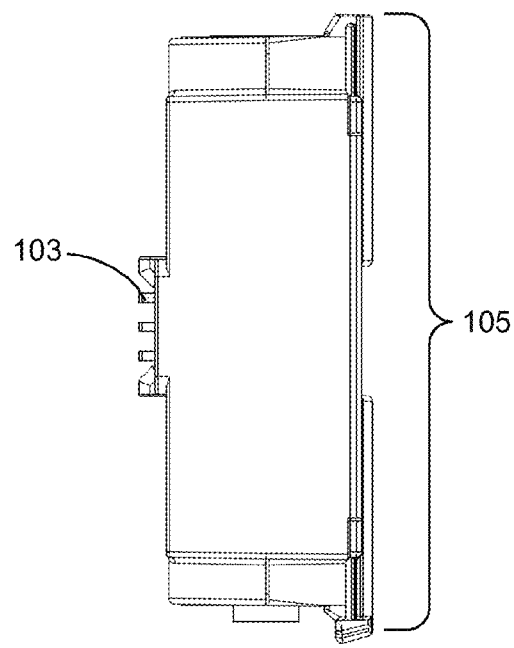
FIG. 10C shows a side view of a battery pack according to embodiments of the invention.

For example, FIGS. 10A-10C may be a slave battery pack. FIG. 10A shows a top view of a battery pack 400 according to an embodiment of the invention. For exemplary purposes, the battery pack 400 is shown in the form of two AA batteries lying side by side. It is understood that different shapes may be used depending on the shape necessary to fit in the device. For example, a device may require just one AA battery, two AA batteries side by side, two AA batteries end to end, or four AAA batteries, etc. Accordingly, the battery pack 100 may be in the form of one AA battery, two AA batteries side by side, two AA batteries end to end, four AAA batteries, etc.

The battery pack 400 in FIG. 10A includes a housing 105 for housing at least one battery cell and a protection circuit. The at least one battery cell and the protection circuit may be housed substantially within the housing 105. The housing may be made of a plastic or other suitable substrate. For exemplary purposes, housing 105 is configured to house two battery cells in the form of two AA batteries lying side by side. The housing 105 may comprise a main body housing for housing the at least one battery cell, and a protection circuit housing 101 for housing a protection circuit.

As shown in FIG. 8, the protection circuit housing 101 (shown as 24) may house slave protection circuit 88. The protection circuit 88 may contain may contain sensors such as temperature sensors. For example, it may be important to determine that the battery cell temperature is in the correct range to charge the battery cell (e.g., not too hot or too cold before beginning to charge) because the battery cell may not charge in circumstances where it is too hot or too cold. For example, if it is already very hot, charging will make it hotter and adding heat to the battery cell may change the chemicals and the way the battery cell behaves. Accordingly, the temperature sensors can tell the recharging circuitry 80 whether it is safe to charge or not. Individual temperature sensors may be used for each battery pack. The protection circuitry may additionally detect when the one or more battery cell is fully charged so that the battery pack can stop charging the one or more battery cell.

The slave protection circuit 88 may be in operative communication with a controller 84 of a master battery pack. For example, the slave protection circuit 88 may be in operative communication with the master battery pack 300 as explained above.

The temperature sensors in the slave protection circuit 88 send signals to the recharging circuitry 80 in the master battery pack 300 so that the recharging circuitry 80 can determine whether to begin charging the at least one battery cell, continue charging the battery cell, or terminate charging of the battery cell. The recharging circuitry 80 and/or the controller 84 can also detect when the device is plugged into an external power supply through the adapter jack 86 so that the recharging circuitry 80 can determine whether to start charging the battery cell. The recharging circuitry 80 and/or the controller 84 can disconnect the external source from the recharging circuitry 80 to terminate charging of the battery cell or detect when the device is unplugged from an external power supply.

As an additional safety mechanism, the device itself may contain a device controller that may receive signals from the temperature sensors in the protection circuit 82 and/or slave protection circuit 88 to determine whether or not to continue supplying power from the external power supply. In the case where the battery pack 400 does not sense that the temperature is too hot or too cold, the device controller may receive signals from the temperature sensors in the protection circuit 82 and/or slave protection circuit 88 and determine if the temperature is too hot or too cold, and may disconnect the main AC jack source from the recharging circuitry 80.

As yet an additional safety mechanism, a separate protection device (e.g., a PTC protection device) may be included between the battery cells. The protection device may be in the form of a disk that fits between the battery cells. This protection device may be purely a mechanical solution that does not require a controller. The protection device may be similar to a fuse and may monitor both current and temperature. The current is conducted though the protection device as long as the current and the temperature are not too high. If the current and temperature are too high, then the protection device opens the circuit so that there is no more current flowing between the battery cells. This provides an additional safety measure. Standard rechargeable batteries do not have this type of protection.

FIG. 10B shows an end view of a battery pack 400 according to embodiments of the invention. The battery pack includes a housing 105 for housing at least one battery cell 104(*a*) and/or 104(*b*) and a protection circuit. The portion of the battery cell 104(*a*) and/or 104(*b*) showing in FIG. 10B may be the positive terminal that has the positive polarity. The housing 105 may comprise a main body housing for housing the at least one battery cell 104(*a*) and/or 104(*b*), and a protection circuit housing for housing a protection circuit, as explained above.

FIG. 10C shows a side view of a battery pack 400 according to embodiments of the invention. As explained in further detail above, the battery pack 400 may include a housing 105 for housing at least one battery cell and protection circuit. The housing 105 may comprise a main body housing for housing the at least one battery cell, and a protection circuit housing for housing a protection circuit.

The battery pack 400 may also include one or more contacts 103. Contacts 103 may be spring contacts that give when they push in. The one or more contacts 103 may be configured to be coupled with connectors on a device as explained below.

Figure 11:
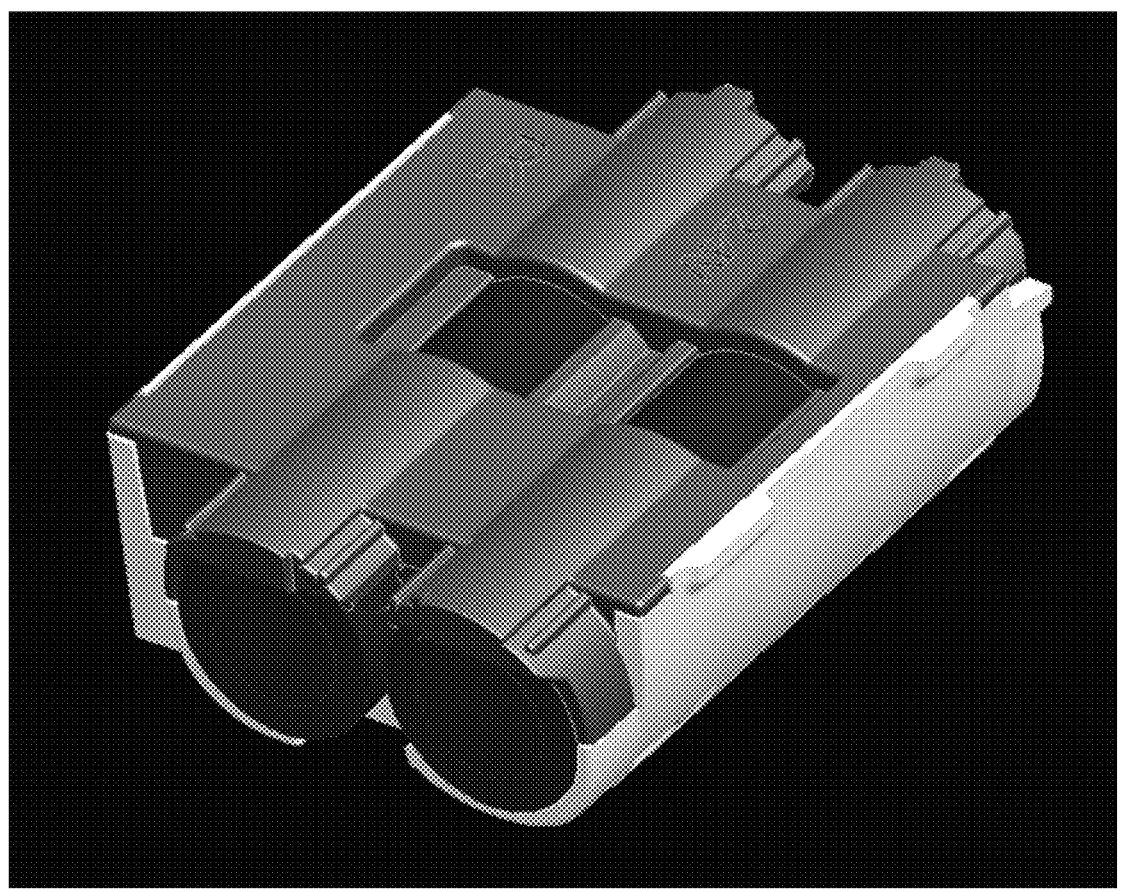
FIG. 11 shows a perspective view of a battery pack according to embodiments of the invention.
Figure 12:
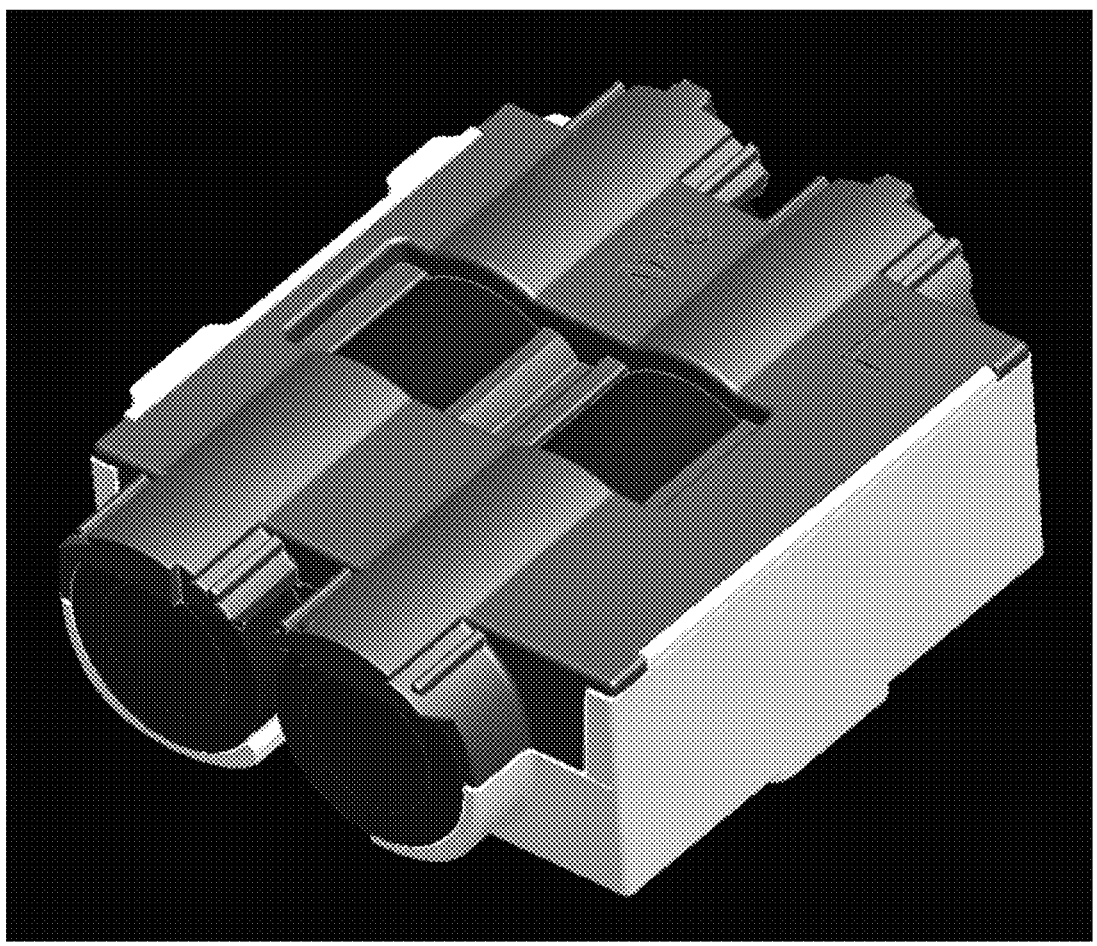
FIG. 12 shows a perspective view of a battery pack according to embodiments of the invention.

FIG. 11 shows a perspective view of a battery pack 300 according to an embodiment of the invention. FIG. 12 shows a perspective view of a battery pack 400 according to an embodiment of the invention.

Figure 13:
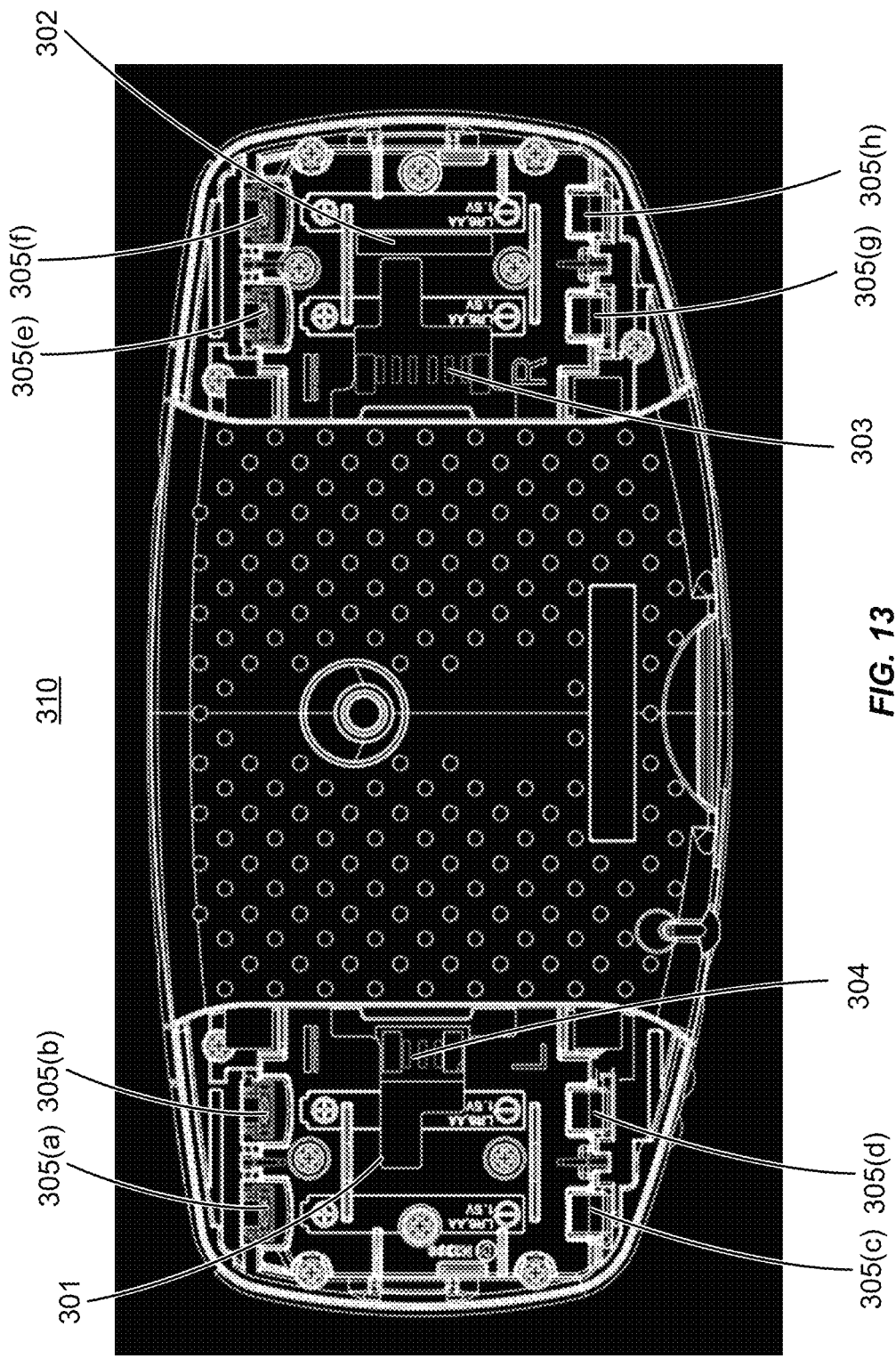
FIGS. 13-17 show a device configured to receive a battery pack according to embodiments of the invention.

FIG. 13 shows a device 310 configured to receive at least one battery pack according to embodiments of the invention. For exemplary purposes, FIG. 13 shows a left compartment 301 and a right compartment 302. The right compartment 302 may be configured to hold a first battery pack 300. The left compartment 301 may be configured to hold a second battery pack 400. It is understood that a device 310 could have a single compartment or more than two compartments depending on the needs of the device. The one or more compartments can also be located in any space on the device 310. For example, the left compartment 301 and right compartment 302 may be located on each side of the device to balance the weight in the product. By not putting a compartment in the middle of the device 310, the product may be thinner if most of the other components are in the middle of the product. A device that has a more balance weight may provide for a better user experience. For example, the device 310 may be a mobile device that is typically held in the user's hand when in use. In another example, the user of the device 310 may be a child and a device with a more balanced weight may be easier to handle by a child.

The left compartment 301 and the right compartment 302 may each be configured to hold standard batteries. In the exemplary device in FIG. 3 the left compartment 301 and the right compartment 302 may each be configured to hold two AA batteries lying side by side. Accordingly, the device 310 may receive either standard batteries or rechargeable battery packs.

The right compartment 302 may be configured to hold a master battery pack 300 that contains recharging circuitry and a protection circuit and the left compartment 301 may be configured to hold a slave battery pack 400 that contains a protection circuit.

The device 30 may also include a right pin connector 303 and a left pin connector 304. It is understood that the right pin connector 303 and the left pin connector 304 may have any number of pins necessary to receive contacts on a battery pack 400 or battery pack 300. For example, the right pin connector 303 may be a six-pin connector and the left pin connector 304 may be a three pin connector. The right pin connector 303 may be configured to receive contacts on a master battery pack 300. For example, the master battery pack 300 may have contacts on the recharging circuitry housing 91. When the master battery pack 300 is installed in the right compartment 302, the contacts touch the right pin connector 303 and a connection is made between the recharging circuit, or the protection circuit, and the device 310. The master battery pack 300 contacts may be spring contacts that are compressible contact (e.g., give when pushed in) to ensure a good fit. For example, when the master battery pack 300 is fully installed, the spring contacts are meant to give by a certain amount (e.g., millimeters) to ensure that the spring contacts are engaged with the right pin connector 303. It may be preferable to have the spring contacts on the battery pack 300 and the connectors on the device to remove the cost of the contacts from the device and put the cost of the contacts in the battery pack 300.

The slave battery pack 400 may have fewer contacts because the slave battery pack 400 may include a protection circuit and not a recharging circuit. For example, the slave battery pack 400 may have contacts on the protection circuit housing 101. When the slave battery pack 400 is installed in the left compartment 301, the contacts touch the left pin connector 304 and a connection is made between the protection circuit and the device 310. The slave battery pack 400 contacts may be spring contacts that are compressible contacts (e.g., give when pushed in) to ensure a good fit. For example, when the slave battery pack 400 is fully installed the spring contacts are meant to give by a certain amount (e.g., millimeters) to ensure that the spring contacts are engaged with the left pin connector 304. It may be preferable to have the contacts in the battery pack 400 and the connectors on the device to remove the cost of the spring contacts from the device and put the cost of the contacts in the battery pack 400.

The device may use connectors 303 and 304 to determine whether a battery pack is installed. If nothing is in contact with the connectors 303 or 304 then the device 310 knows that no battery packs are installed. If there is contact on either connectors 303 or 304 or both, then the device knows that there are battery packs installed in the left compartment or the right compartment or both. The device 310 may require that both battery packs (e.g., master battery pack 300 and slave battery pack 400) be installed to charge the battery packs.

The left compartment 301 and the right compartment 302 may have contacts 305(a)-305(h) to deliver power from the standard batteries or battery packs to the device When the standard batteries or battery packs are installed in the device.

Figure 14:
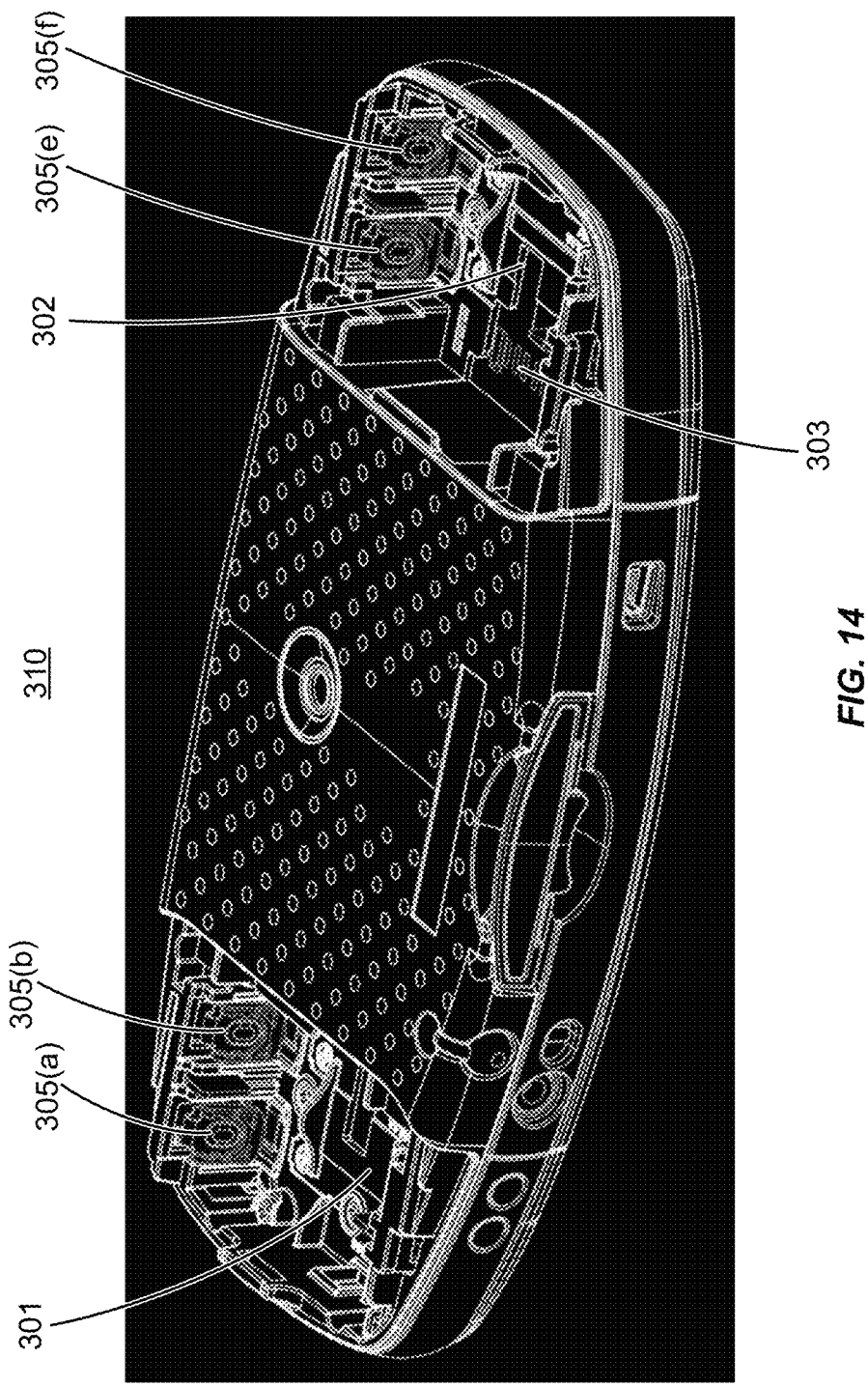
Figure 15:
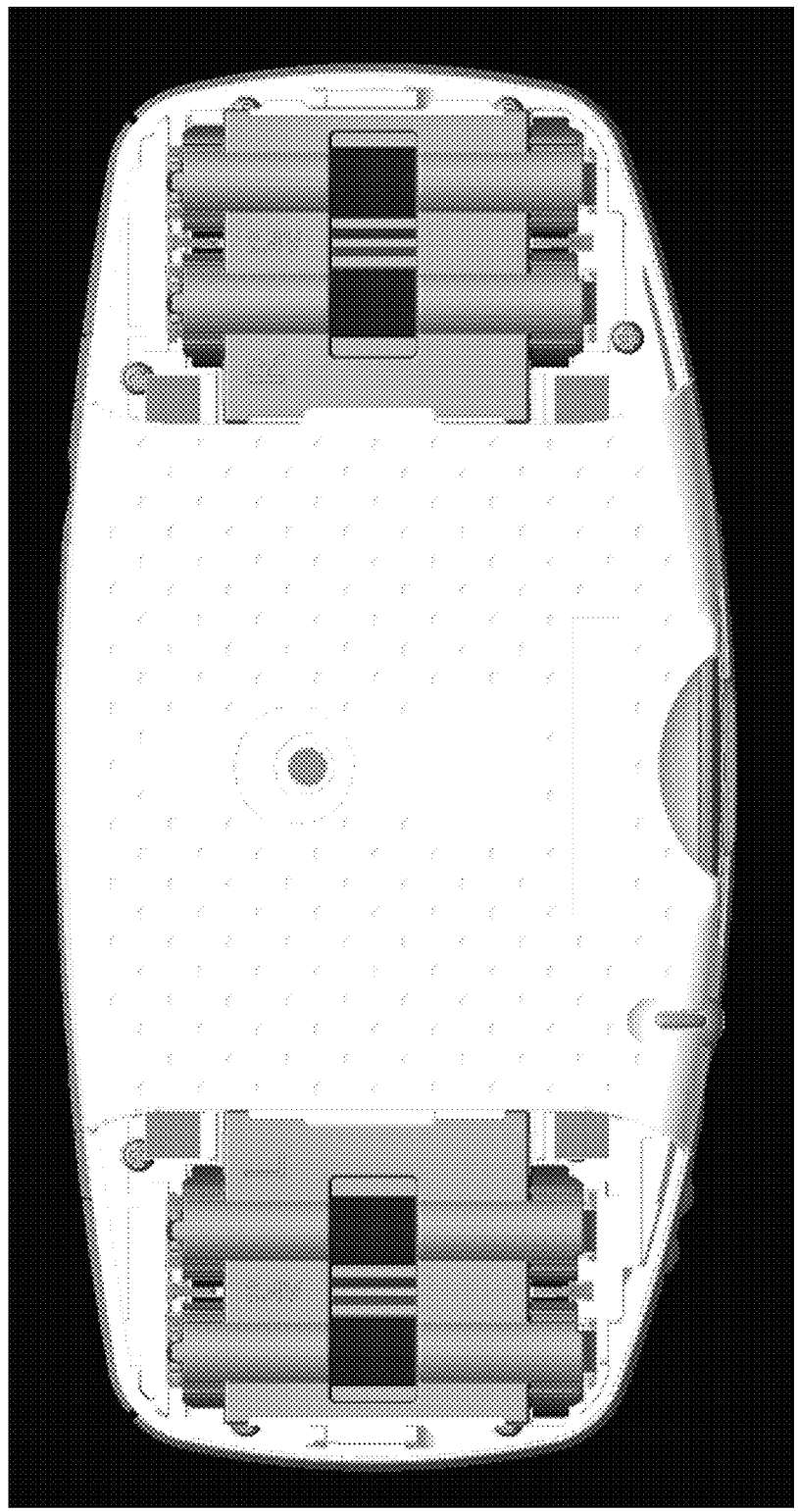

FIG. 14 shows a perspective view of device 310. FIG. 15 is a top view of device 310 showing a battery pack 400 installed in the left compartment 301 and a battery pack 300 installed in a right compartment 302.

Figure 16:
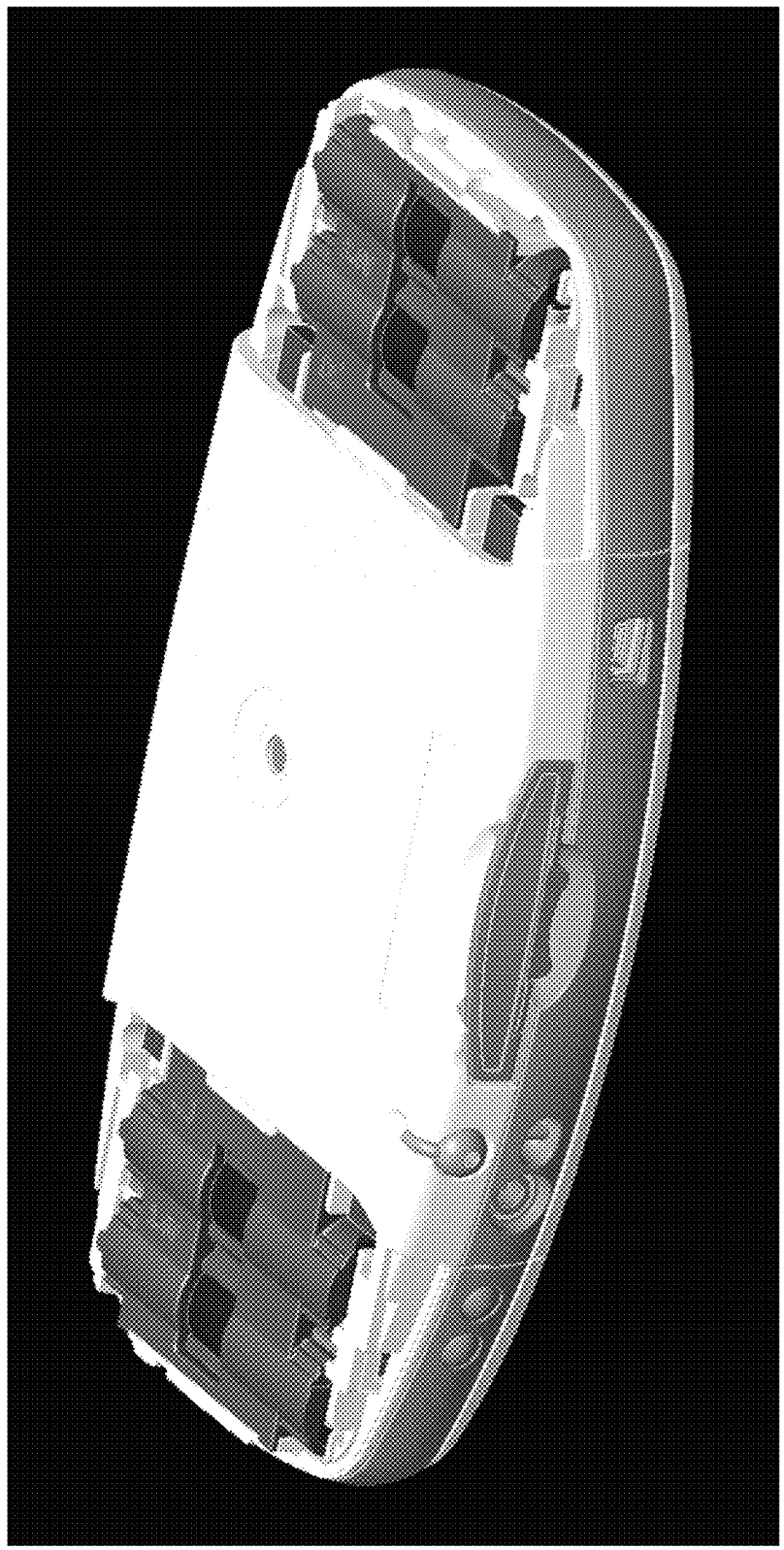
Figure 17:
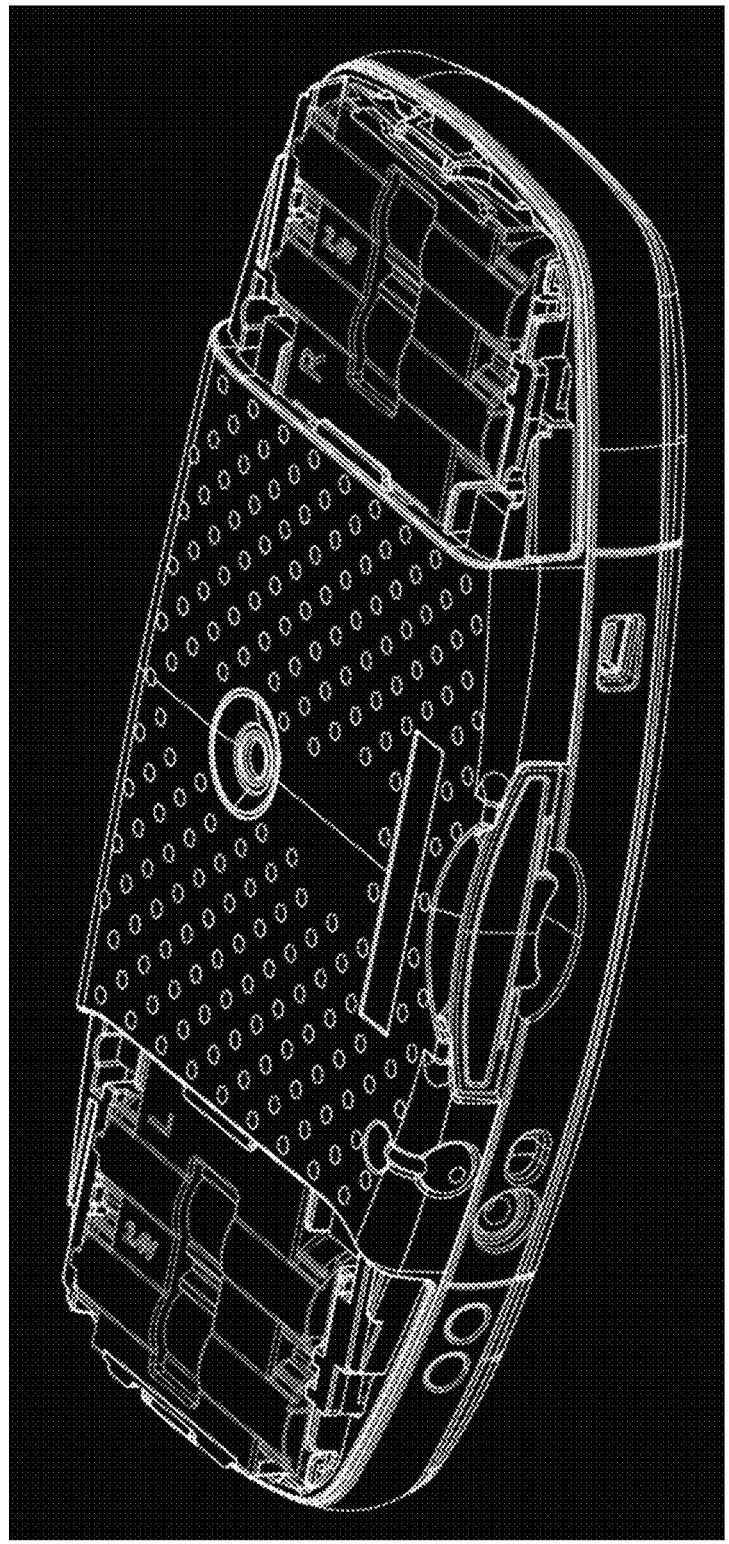

FIG. 16 is a perspective view of device 310 showing a battery pack 400 installed in the left compartment 301 and a battery pack 300 installed in a right compartment 302. FIG. 17 is another perspective view of device 310 showing a battery pack 400 installed in the left compartment 301 and a battery pack 300 installed in a right compartment 302.

The foregoing description is intended to be illustrative, but not limiting, of the scope of the invention which is set forth in the following claims. As can be understood by those of skill in the art, the present invention may be embodied in other specific forms without departing from the essential characteristics thereof.

What is claimed is:

1. A rechargeable battery pack configured to provide power to a device that also accepts at least one standard non-rechargeable battery, the rechargeable battery pack comprising:
 a housing including:
  a main housing portion having a form factor of the at least one standard non-rechargeable battery for housing at least one battery cell; and
  a recharging circuitry housing portion having a shorter length than the main housing portion, the recharging circuitry housing portion extending laterally from the main housing portion for housing a recharging circuitry;
 the recharging circuitry coupled with the at least one battery cell;
 the recharging circuitry configured to charge the at least one battery cell when the rechargeable battery pack is inserted into the device that also accepts the at least one non- rechargeable battery;
 a protection circuit coupled with the recharging circuitry;
 power contacts on the main housing portion configured to provide power from the at least one battery cell to the device; and
 one or more circuitry contacts located on a side of the recharging circuitry housing portion that does not have any of the power contacts, the one or more circuitry contacts configured to electrically couple the recharging circuitry to the device.

2. The rechargeable battery pack of claim 1 wherein the rechargeable battery pack is a master battery pack and the recharging circuitry is further configured to charge at least one battery cell of a separate slave battery pack.

3. The rechargeable battery pack of claim 1 wherein the protection circuit comprises at least one temperature sensor to detect the temperature of the at least one battery cell.

4. The rechargeable battery pack of claim 1 wherein the protection circuit is configured to detect when the at least one battery cell is fully charged.

5. The rechargeable battery pack of claim 1 further comprising:
 a controller coupled with the recharging circuitry and the protection circuit.

6. The rechargeable battery pack of claim 1 further comprising:
 a second battery cell; and
 a protection device coupled with the at least one battery cell and the second battery cell;
 the protection device configured to terminate current flowing between the at least one battery cell and the second battery cell when the current or temperature is higher than a predetermined range.

7. The rechargeable battery pack of claim 1 further comprising:
 a second battery cell housed substantially within the main housing portion, the second battery cell coupled with the recharging circuitry; and
 the recharging circuitry further configured to charge the second battery cell.

8. An electronic device configured to receive power from either at least one standard battery or at least one rechargeable battery pack, the electronic device comprising:
 a housing;
 a compartment in the housing, the compartment configured to receive either the at least one standard battery or the at least one rechargeable battery pack, wherein the compartment includes:
  a main compartment portion having a form factor for fitting the at least one standard battery; and
  a recharging circuitry compartment portion having a length shorter than the main compartment portion, the recharging circuitry compartment portion extending laterally from the main compartment portion;

power contacts located in the main compartment portion of the housing configured to receive power from either the at least one standard battery or the at least one rechargeable battery pack; and a pin connector located on a side of the recharging circuitry compartment portion of the housing that does not have any of the power contacts, the pin connector comprising at least one pin configured to electrically couple the electronic device to a recharging circuitry housed in the at least one rechargeable battery pack when the at least one rechargeable battery pack is inserted into the compartment.

9. The electronic device of claim 8, wherein the at least one rechargeable battery pack is a master battery pack.

10. The electronic device of claim 9 further comprising:
a second compartment in the housing, the second compartment configured to receive either at least one standard battery or a slave rechargeable battery pack; and
a second pin connector on the housing, the second pin connector comprising at least one pin;
the second pin connector configured to receive at least one contact on the slave rechargeable battery pack when the slave rechargeable battery pack is inserted into the second compartment.

11. A system comprising:
an electronic device comprising:
a device housing; and
at least one compartment in the device housing, the at least one compartment configured to receive either at least one standard battery or at least one master rechargeable battery pack; and
a master rechargeable battery pack comprising:
a master battery pack housing including:
a main housing portion having a form factor of the at least one standard battery for housing at least one master battery cell; and
a recharging circuitry housing portion having a length shorter than the main housing portion, the recharging circuitry housing portion extending laterally from the main housing portion for housing a recharging circuitry;
the recharging circuitry coupled with the at least one master battery cell, the recharging circuitry configured to charge the at least one master battery cell when the master rechargeable battery pack is inserted into the electronic device;
power contacts on the main housing portion configured to provide power from the at least one master battery cell to the electronic device; and
one or more circuitry contacts located on a side of the recharging circuitry housing portion that does not have any of the power contacts, the one or more circuitry contacts configured to electrically couple the recharging circuitry to the electronic device.

12. The system of claim 11 further comprising:
a slave rechargeable battery pack comprising:
a slave battery pack housing for housing at least one slave battery cell, the at least one slave battery cell housed substantially within the slave battery pack housing,
wherein the recharging circuitry is further configured to charge the at least one slave battery cell in the slave rechargeable battery pack when the master rechargeable battery pack and the slave rechargeable battery pack are inserted into the device.

13. The system of claim 12 wherein the electronic device is configured to receive power from the master rechargeable battery pack and the slave rechargeable battery pack.

14. The system of claim 11 wherein the master rechargeable battery further comprises a protection circuit coupled with the recharging circuitry.

15. The system of claim 14 wherein the protection circuit comprises at least one temperature sensor to detect the temperature of the at least one master battery cell.

16. The system of claim 12 wherein a protection circuit is configured to detect when the at least one master battery cell is fully charged and the at least one slave battery cell is fully charged.

17. The system of claim 14 wherein the master rechargeable battery pack further comprises:
a controller coupled with the recharging circuitry and the protection circuit.

18. The system of claim 11 wherein the master rechargeable battery pack further comprises:
a second master battery cell; and
a protection device coupled with the at least one master battery cell and the second master battery cell;
the protection device configured to terminate current flowing between the at least on master battery cell and the second master battery cell when the current or temperature is higher than a predetermined range.

19. The system of claim 12 wherein the slave rechargeable battery further comprises a slave protection circuit housed substantially within the slave battery pack housing of the slave rechargeable battery, the slave protection circuit coupled with the at least one battery cell housed substantially within the slave battery pack housing of the slave battery pack.

20. The system of claim 19 wherein the slave protection circuit comprises at least one temperature sensor to detect the temperature of the at least one slave battery cell.

* * * * *